US010157680B2

(12) United States Patent
Yang et al.

(10) Patent No.: US 10,157,680 B2
(45) Date of Patent: Dec. 18, 2018

(54) SUB-BLOCK MODE FOR NON-VOLATILE MEMORY

(71) Applicant: SANDISK TECHNOLOGIES LLC, Plano, TX (US)

(72) Inventors: Xiang Yang, Milpitas, CA (US); Huai-Yuan Tseng, San Ramon, CA (US); Xiaochang Miao, Fremont, CA (US); Deepanshu Dutta, Fremont, CA (US)

(73) Assignee: SANDISK TECHNOLOGIES LLP, Addison, TX (US)

( * ) Notice: Subject to any disclaimer, the term of this patent is extended or adjusted under 35 U.S.C. 154(b) by 0 days.

(21) Appl. No.: 15/385,454

(22) Filed: Dec. 20, 2016

(65) Prior Publication Data
US 2017/0178736 A1    Jun. 22, 2017

Related U.S. Application Data

(60) Provisional application No. 62/271,155, filed on Dec. 22, 2015.

(51) Int. Cl.
*G11C 16/06* (2006.01)
*G11C 16/34* (2006.01)
(Continued)

(52) U.S. Cl.
CPC ...... *G11C 16/3427* (2013.01); *G11C 11/5628* (2013.01); *G11C 11/5635* (2013.01);
(Continued)

(58) Field of Classification Search
CPC .......................... G11C 16/10; G11C 16/3459
(Continued)

(56) References Cited

U.S. PATENT DOCUMENTS

| 7,170,788 | B1 | 1/2007 | Wan |
| 8,897,070 | B2 | 11/2014 | Dong |
| 8,913,431 | B1 | 12/2014 | Costa |
| 9,036,428 | B1 | 5/2015 | d'Abreu |
| 9,286,989 | B2 | 3/2016 | d'Abreu |
| 9,412,463 | B1 | 8/2016 | Chen |

(Continued)

OTHER PUBLICATIONS

PCT International Search Report dated Mar. 20, 2017, PCT Patent Application PCT/US2016/068128.
PCT Written Opinion of the International Searching Authority dated Mar. 20, 2017, PCT Patent Application PCT/US2016/068128.

*Primary Examiner* — Hoai V Ho
(74) *Attorney, Agent, or Firm* — Vierra Magen Marcus LLP

(57) ABSTRACT

Systems and methods for reducing residual electrons within a NAND string subsequent to performing a sensing operation using the NAND string or during the sensing operation. A middle-out programming sequence may be performed in which memory cell transistors in the middle of the NAND string are programmed and program verified prior to programming and verifying other memory cell transistors towards the drain-side end of the NAND string and/or the source-side end of the NAND string. In one example, for a NAND string with 32 memory cell transistors corresponding with word lines WL0 through WL31 from the source-side end of the NAND string to the drain-side end of the NAND string, the memory cell transistor corresponding with word line WL16 may be programmed and program verified prior to programming the memory cell transistors corresponding with word lines WL15 and WL17.

18 Claims, 15 Drawing Sheets

(51) Int. Cl.
  *G11C 11/56* (2006.01)
  *G11C 16/04* (2006.01)
  *G11C 16/10* (2006.01)
  *G11C 16/16* (2006.01)
  *G11C 16/26* (2006.01)
  *G11C 16/08* (2006.01)

(52) U.S. Cl.
  CPC ...... *G11C 11/5642* (2013.01); *G11C 16/0483* (2013.01); *G11C 16/10* (2013.01); *G11C 16/16* (2013.01); *G11C 16/26* (2013.01); *G11C 16/3459* (2013.01); *G11C 16/08* (2013.01); *G11C 2211/5648* (2013.01)

(58) Field of Classification Search
  USPC ........................................ 365/185.22, 185.28
  See application file for complete search history.

(56) References Cited

U.S. PATENT DOCUMENTS

| | | | |
|---|---|---|---|
| 2014/0043915 A1* | 2/2014 | Choi | G11C 16/10 |
| | | | 365/185.25 |
| 2014/0063938 A1 | 3/2014 | Oh | |
| 2014/0138609 A1 | 5/2014 | Satoh | |
| 2014/0247664 A1 | 9/2014 | Hosono | |
| 2015/0003150 A1* | 1/2015 | Aritome | G11C 16/3427 |
| | | | 365/185.02 |
| 2015/0036430 A1* | 2/2015 | Sukegawa | G11C 16/10 |
| | | | 365/185.11 |
| 2016/0180945 A1* | 6/2016 | Ng | G11C 11/5628 |
| | | | 365/185.03 |

\* cited by examiner

First programming pass

Second programming pass

SUB-BLOCK MODE FOR NON-VOLATILE MEMORY

CLAIM OF PRIORITY

The present application claims priority to U.S. Provisional Application No. 62/271,155, entitled "Non-Volatile Storage System with Sub-Block Programming and Erasing," filed Dec. 22, 2015, which is herein incorporated by reference in its entirety.

BACKGROUND

Semiconductor memory is widely used in various electronic devices such as cellular telephones, digital cameras, personal digital assistants, medical electronics, mobile computing devices, and non-mobile computing devices. Semiconductor memory may comprise non-volatile memory or volatile memory. A non-volatile memory allows information to be stored and retained even when the non-volatile memory is not connected to a source of power (e.g., a battery). Examples of non-volatile memory include flash memory (e.g., NAND-type and NOR-type flash memory), Electrically Erasable Programmable Read-Only Memory (EEPROM), ferroelectric memory (e.g., FeRAM), magnetoresistive memory (e.g., MRAM), and phase change memory (e.g., PRAM or PCM). A non-volatile memory may utilize floating-gate transistors or charge trap transistors. The ability to adjust the threshold voltage of a floating-gate transistor or charge trap transistor allows the transistor to act as a non-volatile storage element or memory cell. In some cases, more than one data bit per memory cell (i.e., a multi-level or multi-state memory cell) may be provided by programming and reading multiple threshold voltages or threshold voltage ranges.

NAND flash memory structures typically arrange multiple floating-gate transistors or multiple charge trap transistors in series with and between two select gates. The memory cell transistors in series and the select gates may be referred to as a NAND string. In recent years, NAND flash memory has been scaled in order to reduce cost per bit. However, as process geometries shrink, many design and process challenges are presented. These challenges include increased variability in transistor characteristics over process, voltage, and temperature variations.

DETAILED DESCRIPTION

Figure 1:
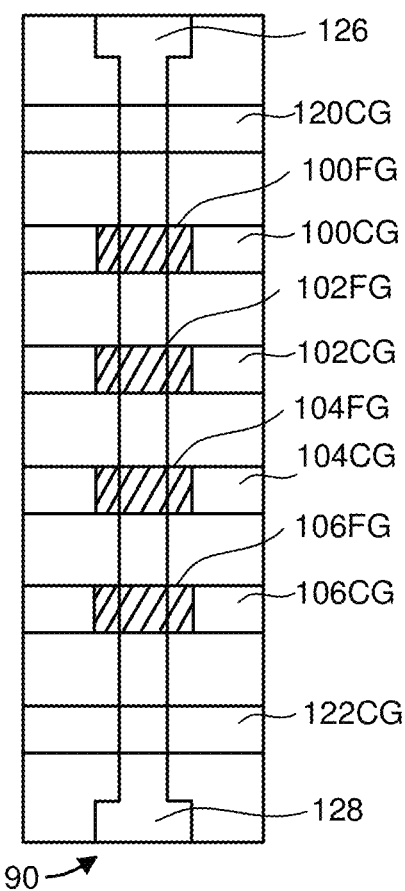
FIG. 1 depicts one embodiment of a NAND string.

Technology is described for eliminating or reducing residual electrons within a NAND string subsequent to performing a sensing operation using the NAND string (e.g., a read operation or a program verify operation) or during the sensing operation. In some cases, a middle-out programming sequence may be performed in which memory cell transistors in the middle of the NAND string are programmed and program verified prior to programming and verifying other memory cell transistors towards the drain-side end of the NAND string and/or the source-side end of the NAND string. In one example, for a NAND string with 32 memory cell transistors corresponding with word lines WL0 through WL31 from the source-side end of the NAND string to the drain-side end of the NAND string, the memory cell transistor corresponding with word line WL16 may be programmed and program verified prior to programming the memory cell transistor corresponding with word line WL15. In another example, the memory cell transistor corresponding with word line WL16 may be programmed and program verified prior to programming the memory cell transistor corresponding with word line WL15 and prior to programming the memory cell transistor corresponding with word line WL17. In another example, the memory cell transistor corresponding with word line WL16 may be programmed and program verified prior to beginning programming of the memory cell transistor corresponding with word line WL15 and the memory cell transistor corresponding with word line WL15 may be programmed and program verified prior to beginning programming of the memory cell transistor corresponding with word line WL14.

In some cases, the middle-out programming sequence in which memory cell transistors in the middle of a NAND string are programmed and verified prior to programming and verifying other memory cell transistors towards the ends of the NAND string may be referred to as "sub-block mode," "Xiang-mode," or "X-mode" programming as the programming and verifying may be performed symmetrically from the middle or center of the NAND string towards the drain-side and source-side ends of the NAND string. In some cases, a middle-out erase sequence in which memory cell transistors in the middle of a NAND string are erased prior to erasing other memory cell transistors towards the ends of the NAND string may be referred to as "sub-block mode," "Xiang-mode," or "X-mode" erasing as the erase operations may be performed symmetrically from the middle or center of the NAND string towards the drain-side and source-side ends of the NAND string.

In some cases, after a program verify operation has been performed for a memory cell transistor within a NAND string, free electrons within an inverted polysilicon channel of the NAND string created during the program verify operation may become trapped at polysilicon grain boundaries and require additional time to recombine. These residual free electrons may degrade channel boosting during a subsequent programming operation subsequent to the program verify operation leading to program disturb. During the subsequent programming operation, memory cells that have reached their final programming states may be inhibited from programming by boosting the channel regions of the program inhibited memory cells; channel regions that are not sufficiently boosted will cause unintentional programming of the corresponding program inhibited memory cells. One benefit of performing a middle-out programming sequence is that the number of residual electrons remaining within the polysilicon channel of the NAND string may be reduced by encouraging residual electrons (or residue electrons) to pass through the source-side select transistor and/or the drain-side select transistor during or at the end of the program verify operation. Furthermore, control circuitry or memory array biasing circuitry may provide bias conditions to remove residual electrons from the polysilicon channel of the NAND string at the end of the program verify operation including charging the polysilicon channel or a portion of the polysilicon channel to a voltage greater than ground, greater than the source line voltage applied at the source-side end of the NAND string during the program verify operation, or greater than the bit line voltage applied at the drain-side end of the NAND string during the program verify operation. Charging the polysilicon channel to a voltage greater than ground will draw out a greater number of residual electrons. The voltage applied to the polysilicon channel may be provided from either the source-side end of the NAND string (e.g., by biasing the source line) or the drain-side end of the NAND string (e.g., by biasing the bit line).

A NAND string may include a tier select gate transistor arranged between and in series with a first set of memory cell transistors and a second set of memory cell transistors. In one embodiment, the number of transistors in the first set of memory cell transistors may be the same as or different from the number of transistors in the second set of memory cell transistors. For example, the first set of memory cell transistors may comprise 16 total transistors and the second set of memory cell transistors may comprise 32 total transistors, 16 total transistors, or 8 total transistors. One end of the first set of memory cell transistors may connect to a bit line while the other end of the first set of memory cell transistors may be connected to the tier select gate transistor. In this case, the tier select gate transistor may electrically isolate the first set of memory cell transistors from the second set of memory cell transistors when the tier select gate transistor is set into a non-conducting state. The tier select gate transistor may have a first transistor channel length that is different from the transistor channel lengths used for the first set of memory cell transistors and/or the second set of memory cell transistors. The first channel length may be greater than any of the transistor channel lengths used for the first set of memory cell transistors and the second set of memory cell transistors. For example, the first channel length may be three times greater than the transistor channel lengths used for the first set of memory cell transistors and the second set of memory cell transistors.

In one embodiment, at the end of a program verify operation, a tier select gate transistor may be set into a non-conducting state in order to prevent a conducting path between a bit line at the drain-side end of the NAND string and a source line at the source-side end of the NAND string. Subsequently, a conducting path for any residual electrons may be provided from a source of the tier select gate transistor to the source line and/or from a drain of the tier select gate transistor to the bit line. In one example, at the end of a program verify operation, a tier select gate transistor is set into a non-conducting state while all transistors arranged between the tier select gate transistor and the source line at the source-side end of the NAND string are set into conducting states. In another example, at the end of a program verify operation, a tier select gate transistor is set into a non-conducting state while all transistors arranged between the tier select gate transistor and the source line at the source-side end of the NAND string are set into conducting states and all transistors arranged between the tier select gate transistor and the bit line at the drain-side end of the NAND string are set into conducting states.

In another embodiment, at the end of a program verify operation, rather than using a tier select gate transistor to prevent a conducting path between a bit line at the drain-side end of a NAND string and a source line at the source-side end of the NAND string, a memory cell transistor or a dummy transistor within the NAND string (e.g., in the middle of the NAND string) may be set into a non-conducting state (e.g., by biasing the gate of the transistor to ground or 0V). Thereafter, a path for any residual electrons may be provided from a source of the non-conducting transistor to the source line and/or from a drain of the non-conducting transistor to the bit line.

In one embodiment, a non-volatile storage system may include one or more two-dimensional arrays of non-volatile memory cells. The memory cells within a two-dimensional memory array may form a single layer of memory cells and may be selected via control lines (e.g., word lines and bit lines) in the X and Y directions. In another embodiment, a non-volatile storage system may include one or more monolithic three-dimensional memory arrays in which two or more layers of memory cells may be formed above a single substrate without any intervening substrates. In some cases, a three-dimensional memory array may include one or more vertical columns of memory cells located above and orthogonal to a substrate or substantially orthogonal to the substrate (e.g., within 2-5 degrees of a normal vector that is orthogonal to the substrate). In one example, a non-volatile storage system may include a memory array with vertical bit lines or bit lines that are arranged orthogonal to a semiconductor substrate. The substrate may comprise a silicon substrate. The memory array may comprise various memory structures including planar NAND structures, vertical NAND structures, Bit Cost Scalable (BiCS) NAND structures, 3D NAND structures, or 3D ReRAM structures.

3D NAND (e.g., BiCS) opened a new avenue for further scaling down NAND and extending storage density. However, block size has increased over several generations, primarily due to the aggressive growth in the number of word lines. This trend predicts a negative impact from a system perspective, including slow internal data relocation, inefficient media partitioning and degraded user endurance. To help enable further scaling in light of the increase in block size, partial block programming and erase operations may be performed in which memory operations are performed on a portion of a memory block (e.g., a programming or erase operation may be performed on memory cells connected to a subset of word lines within a memory block less than all of the word lines in the memory block). In some embodiments, two-sided partial block erase operations may be performed on a NAND string in which a source-side erase operation for erasing a second set of memory cell transistors from the source-side of the NAND string injects holes from a p-well and a drain-side erase operation for erasing a first set of memory cell transistors from the drain-side of the NAND string uses gate induced drain leakage (GIDL).

In some embodiments, a non-volatile storage system may include a non-volatile memory that is monolithically formed in one or more physical levels of arrays of memory cells having an active area disposed above a silicon substrate. The non-volatile storage system may also include circuitry associated with the operation of the memory cells (e.g., decoders, state machines, page registers, or control circuitry for controlling the reading or programming of the memory cells). The circuitry associated with the operation of the memory cells may be located above the substrate or located within the substrate.

In some embodiments, a non-volatile storage system may include a monolithic three-dimensional memory array. The monolithic three-dimensional memory array may include one or more levels of memory cells. Each memory cell within a first level of the one or more levels of memory cells may include an active area that is located above a substrate (e.g., above a single-crystal substrate or a crystalline silicon substrate). In one example, the active area may include a semiconductor junction (e.g., a P-N junction). The active area may include a portion of a source or drain region of a transistor. In another example, the active area may include a channel region of a transistor.

Figure 2:
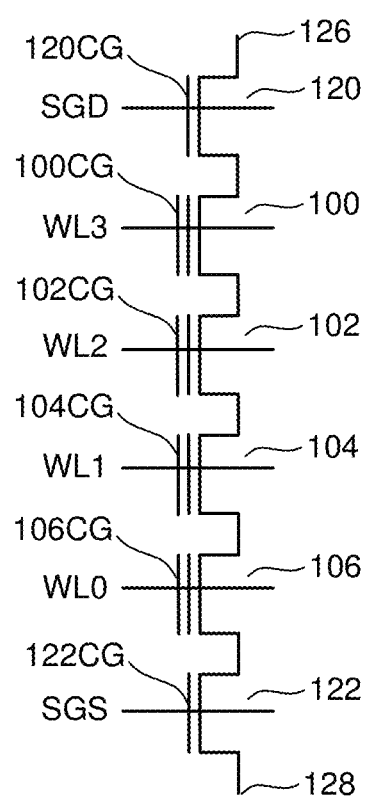
FIG. 2 depicts one embodiment of the NAND string of FIG. 1 using a corresponding circuit diagram.

FIG. 1 depicts one embodiment of a NAND string 90. FIG. 2 depicts one embodiment of the NAND string of FIG. 1 using a corresponding circuit diagram. As depicted, NAND string 90 includes four transistors, 100, 102, 104, and 106, in series between a first select gate 120 (i.e., a drain-side select gate) and a second select gate 122 (i.e., a source-side select gate). Select gate 120 connects the NAND string 90 to a bit line 126. Select gate 122 connects the NAND string 90 to a source line 128. Select gate 120 is controlled by applying the appropriate voltage to control gate 120CG (i.e., via select line SGD of FIG. 2). Select gate 122 is controlled by applying the appropriate voltage to control gate 122CG (i.e., via select line SGS of FIG. 2). Each of the transistors 100, 102, 104, and 106 includes a control gate and a floating gate. For example, transistor 100 includes control gate 100CG and floating gate 100FG, transistor 102 includes control gate 102CG and floating gate 102FG, transistor 104 includes control gate 104CG and floating gate 104FG, and transistor 106 includes control gate 106CG and floating gate 106FG. Control gates 100CG, 102CG, 104CG, and 106CG are connected to word lines WL3, WL2, WL1, and WL0, respectively.

Note that although FIGS. 1 and 2 show four floating-gate transistors in the NAND string, the use of four floating-gate transistors is only provided as an example. A NAND string may have less than or more than four floating-gate transistors (or memory cells). For example, some NAND strings may include 16 memory cells, 32 memory cells, 64 memory cells, 128 memory cells, etc. The discussion herein is not limited to any particular number of memory cells in a NAND string. One embodiment uses NAND strings with 66 memory cells, where 64 memory cells are used to store data and two of the memory cells are referred to as dummy memory cells because they do not store data.

A typical architecture for a flash memory system using a NAND flash memory structure includes a plurality of NAND strings within a memory block. A memory block may comprise a unit of erase. In some cases, the NAND strings within a memory block may share a common well (e.g., a P-well). Each NAND string may be connected to a common source line by its source-side select gate (e.g., controlled by select line SGS) and connected to its associated bit line by its drain-side select gate (e.g., controlled by select line SGD). Typically, each bit line runs on top of (or over) its associated NAND string in a direction perpendicular to the word lines and is connected to a sense amplifier.

In some embodiments, during a programming operation, storage elements that are not to be programmed (e.g., storage elements that have previously completed programming to a target data state) may be inhibited or locked out from programming by boosting associated channel regions (e.g., self-boosting the channel regions via word line coupling). An unselected storage element (or unselected NAND string) may be referred to as an inhibited or locked out storage element (or inhibited NAND string) as it is inhibited or locked out from programming during a given programming iteration of a programming operation.

Although technology using NAND-type flash memory may be described herein, the technology disclosed herein may also be applied to other types of non-volatile storage devices and architectures. Moreover, although technology using floating-gate transistors is described herein, the technology described herein may also be applied to or used with other memory technologies including those that employ charge trapping, phase-change (e.g., chalcogenide materials), or state-change materials.

Figure 3A:
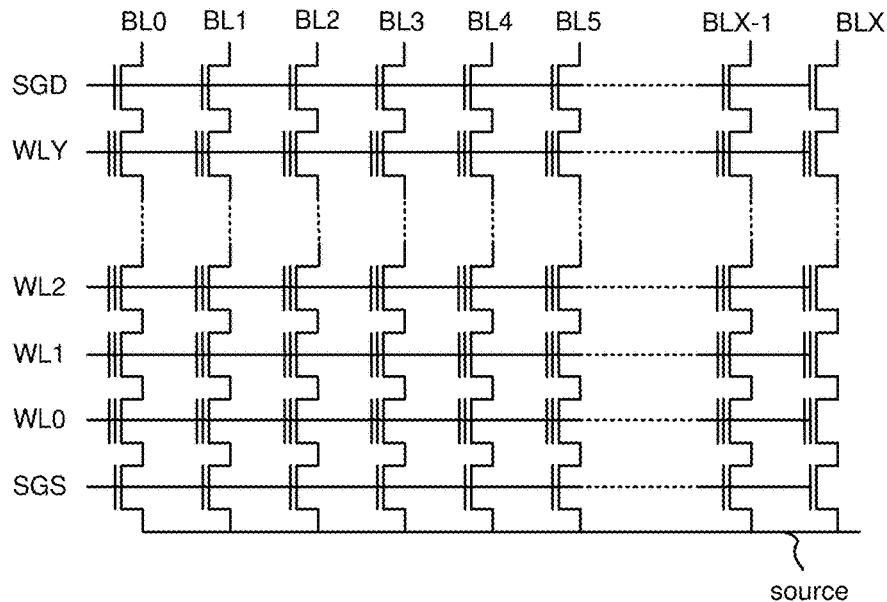
FIG. 3A depicts one embodiment of a memory block including a plurality of NAND strings.

FIG. 3A depicts one embodiment of a memory block including a plurality of NAND strings. As depicted, each NAND string includes (Y+1) memory cells. Each NAND string is connected to one bit line out of (X+1) bit lines on the drain side (i.e., one bit line of bit lines BL0-BLX) via a drain-side select gate controlled by the drain-side selection signal SGD. Each NAND string is connected to a source line (source) via a source-side select gate controlled by source-side selection signal SGS. In one embodiment, the source-side select gate controlled by source-side selection signal SGS and the drain-side select gate controlled by the drain-side selection signal SGD may comprise transistors without floating gates or transistors that include a floating gate structure.

In one embodiment, during a programming operation, when programming a memory cell, such as a NAND flash memory cell, a program voltage may be applied to the control gate of the memory cell and the corresponding bit line may be grounded. These programming bias conditions may cause electrons to be injected into the floating gate via field-assisted electron tunneling, thereby raising the threshold voltage of the memory cell. The program voltage applied to the control gate during a program operation may be applied as a series of pulses. In some cases, the magnitude of the programming pulses may be increased with each successive pulse by a predetermined step size. Between programming pulses, one or more verify operations may be performed. During the programming operation, memory cells that have reached their intended programming states may be locked out and inhibited from programming by boosting the channel regions of the program inhibited memory cells.

In one embodiment, memory cells may be erased by raising the p-well to an erase voltage (e.g., 20 volts) for a sufficient period of time and grounding the word lines of a selected block of memory cells while the source and bit lines are floating. These erase bias conditions may cause electrons to be transferred from the floating gate through the tunneling oxide, thereby lowering the threshold voltage of the memory cells within the selected block. In some cases, an erase operation may be performed on an entire memory plane, on individual blocks within a memory plane, or another unit of memory cells.

In some embodiments, during verify operations and/or read operations, a selected word line may be connected (or biased) to a voltage, a level of which is specified for each read and verify operation in order to determine whether a threshold voltage of a particular memory cell has reached such level. After applying the word line voltage, the conduction current of the memory cell may be measured (or sensed) to determine whether the memory cell conducted a sufficient amount of current in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell. In some cases, during a verify operation, the source line may be set to 0V, to 1V, or to any voltage greater than or less than ground. In one example, during a verify operation, the source line may be set to 1V and the selected word line may be set to 5V. In another example, during a verify operation, the source line may be set to 3V and the selected word line may be set to 2V.

There are many ways to measure the conduction current of a memory cell during a read or verify operation. In one example, the conduction current of a memory cell may be measured by the rate it discharges or charges a dedicated capacitor in a sense amplifier. In another example, the conduction current of the selected memory cell allows (or fails to allow) the NAND string that included the memory cell to discharge a voltage on the corresponding bit line. The voltage of the bit line (or the voltage across a dedicated capacitor in a sense amplifier) may be measured after a period of time to determine whether the bit line has been discharged by a particular amount or not.

Figure 3B:
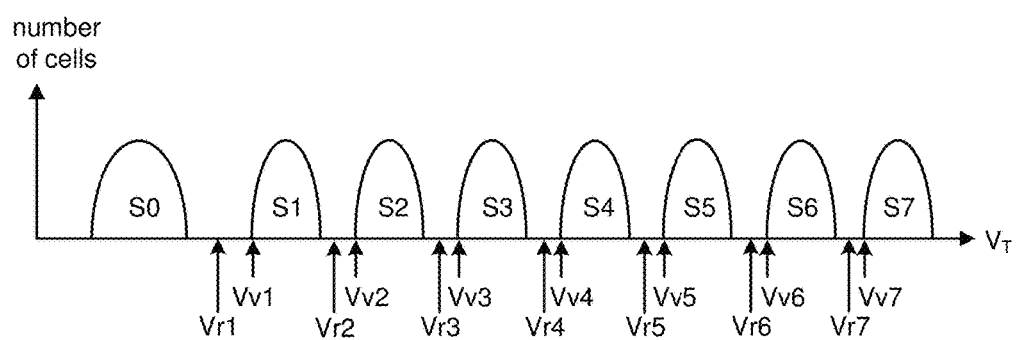
FIG. 3B depicts one embodiment of possible threshold voltage distributions for a three-bit-per-cell memory cell.

FIG. 3B depicts one embodiment of possible threshold voltage distributions (or data states) for a three-bit-per-cell memory cell (i.e., the memory cell may store three bits of data). Other embodiments, however, may use more than or less than three bits of data per memory cell (e.g., such as four or more bits of data per memory cell). At the end of a successful programming process (with verification), the threshold voltages of memory cells within a memory page or memory block should be within one or more threshold voltage distributions for programmed memory cells or within a distribution of threshold voltages for erased memory cells, as appropriate.

As depicted, each memory cell may store three bits of data; therefore, there are eight valid data states S0-S7. In one embodiment, data state S0 is below 0 volts and data states S1-S7 are above 0 volts. In other embodiments, all eight data states are above 0 volts, or other arrangements can be implemented. In one embodiment, the threshold voltage distribution S0 is wider than distributions S1-S7.

Each data state S0-S7 corresponds to a unique value for the three bits stored in the memory cell. In one embodiment, S0=111, S1=110, S2=101, S3=100, S4=011, S5=010, S6=001 and S7=000. Other mappings of data to states S0-S7 can also be used. In one embodiment, all of the bits of data stored in a memory cell are stored in the same logical page. In other embodiments, each bit of data stored in a memory cell corresponds to different pages. Thus, a memory cell storing three bits of data would include data in a first page, a second page, and a third page. In some embodiments, all of the memory cells connected to the same word line would store data in the same three pages of data. In some embodiments, the memory cells connected to a word line can be grouped into different sets of pages (e.g., by odd and even bit lines).

In some example implementations, the memory cells will be erased to state S0. From state S0, the memory cells can be programmed to any of states S1-S7. Programming may be performed by applying a set of pulses with rising magnitudes to the control gates of the memory cells. Between pulses, a set of verify operations may be performed to determine whether the memory cells being programmed have reached their target threshold voltage (e.g., using verify levels Vv1, Vv2, Vv3, Vv4, Vv5, Vv6, and Vv7). Memory cells being programmed to state S1 will be tested to see if their threshold voltage has reached Vv1. Memory cells being programmed to state S2 will be tested to see if their threshold voltage has reached Vv2. Memory cells being programmed to state S3 will be tested to see if their threshold voltage has reached Vv3. Memory cells being programmed to state S4 will be tested to see if their threshold voltage has reached Vv4. Memory cells being programmed to state S5 will be tested to see if their threshold voltage has reached Vv5. Memory cells being programmed to state S6 will be tested to see if their threshold voltage has reached Vv6. Memory cells being programmed to state S7 will be tested to see if their threshold voltage has reached Vv7.

When reading memory cells that store three bits of data, multiple reads will be performed at read compare points Vr1, Vr2, Vr3, Vr4, Vr5, Vr6, and Vr7 to determine which state the memory cells are in. If a memory cell turns on in response to Vr1, then it is in state S0. If a memory cell turns on in response to Vr2 but does not turn on in response to Vr1, then it is in state S1. If a memory cell turns on in response to Vr3 but does not turn on in response to Vr2, then it is in state S2. If a memory cell turns on in response to Vr4 but does not turn on in response to Vr3, then it is in state S3. If a memory cell turns on in response to Vr5 but does not turn on in response to Vr4, then it is in state S4. If a memory cell turns on in response to Vr6 but does not turn on in response to Vr5, then it is in state S5. If a memory cell turns on in response to Vr7 but does not turn on in response to Vr6, then it is in state S6. If a memory cell does not turn on in response to Vr7, then it is in state S7.

Figure 3C:
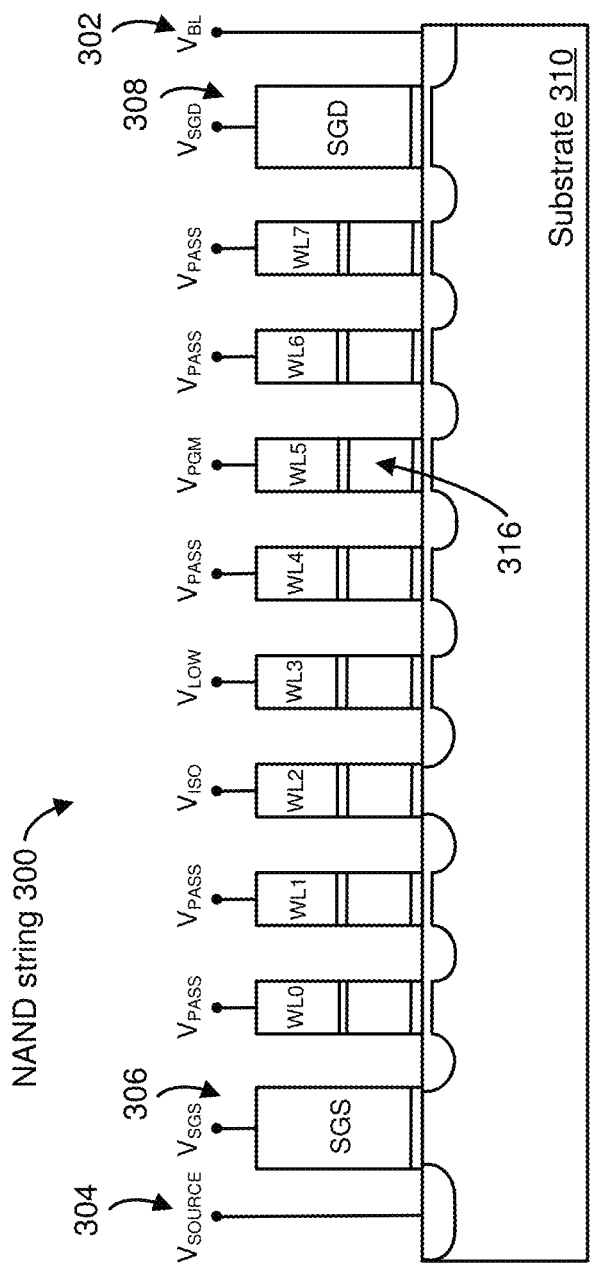
FIG. 3C depicts one embodiment of a NAND string during a programming operation.

FIG. 3C depicts one embodiment of a NAND string 300 during a programming operation. When programming a storage element (e.g., the storage element 316 associated with WL5) of the NAND string 300, a programming voltage may be applied to the selected word line associated with the storage element and a low voltage (e.g., ground) may be applied to the bit line associated with the storage element. As depicted, the NAND string 300 includes a source-side select gate 306, a drain-side select gate 308, and eight word lines WL0-WL7 formed above a substrate 310. $V_{SGS}$ may be applied to the source-side select gate 306 and $V_{SGD}$ may be applied to the drain-side select gate 308. The bit line 302 may be biased to VBA and the source line 304 may be biased to $V_{SOURCE}$. During a programming operation, a programming voltage, $V_{PGM}$, may be applied to selected word line WL5, which is associated with a selected storage element 316.

In one example of a boosting mode, when storage element 316 is the selected storage element, a relatively low voltage, $V_{LOW}$ (e.g., 2-6V) may be applied to a source-side word line (WL3), while an isolation voltage, $V_{ISO}$ (e.g., 0-4V) may be applied to another source-side word line (WL2), referred to as an isolation word line and a pass voltage, $V_{PASS}$, may be applied to the remaining word lines associated with NAND string 300 (in this case word lines WL0, WL1, WL4, WL6, and WL7). While the absolute values of $V_{ISO}$ and $V_{LOW}$ may vary over a relatively large and partly overlapping range, $V_{ISO}$ may be less than $V_{LOW}$. In some cases, $V_{ISO}$ may be less than $V_{LOW}$ which is less than $V_{PASS}$ which is less than $V_{PGM}$.

In some cases, a vertical NAND structure may comprise a vertical NAND string or a vertical inverted NAND string. A NAND string may comprise a string of floating gate transistors. An inverted NAND string may comprise a string of inverted floating gate transistors.

Figure 4A:
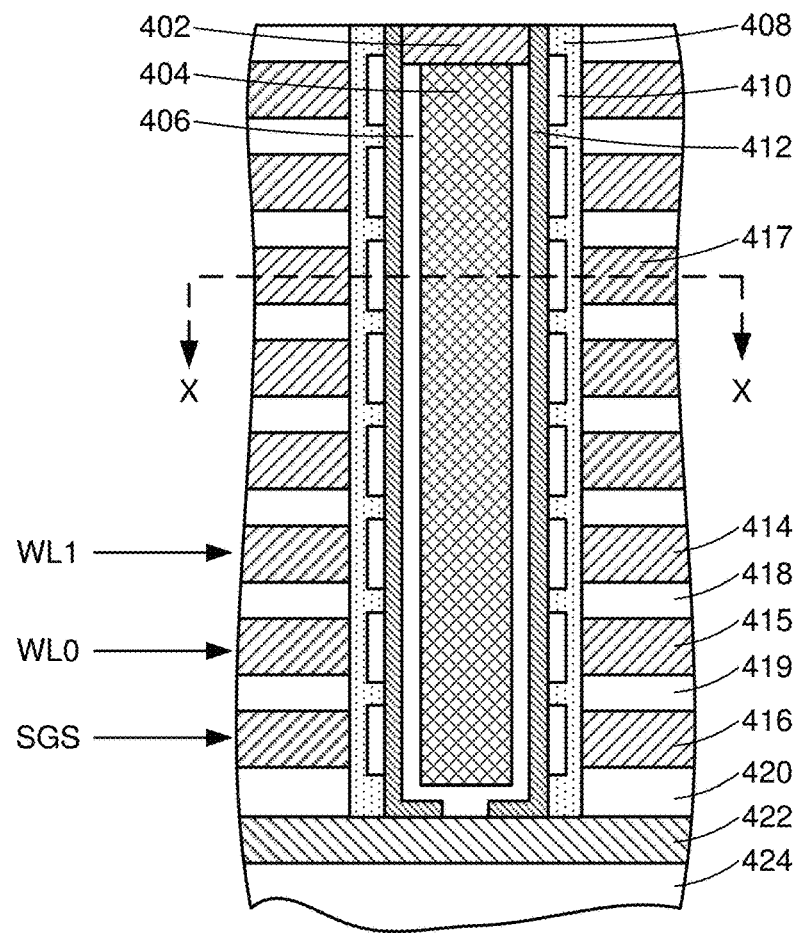
FIG. 4A depicts one embodiment of a vertical NAND structure.

FIG. 4A depicts one embodiment of a vertical NAND structure. The vertical NAND structure includes an inverted NAND string formed above the substrate 424 and oriented such that the inverted NAND string is orthogonal to the substrate 424. An inverted NAND string may comprise a NAND string that includes an inverted floating gate transistor with a tunneling oxide between a floating gate of the inverted floating gate transistor and a control gate of the inverted floating gate transistor. The arrangement of the tunneling oxide between the floating gate and the control gate allows the mechanism (e.g., F-N tunneling as the transport mechanism) for programming and/or erase of the inverted floating gate transistor to occur between the floating gate and the control gate rather than between the floating gate and the channel of the inverted floating gate transistor. The inverted NAND string may be arranged within a vertical memory hole that is etched through alternating layers of control gate material (e.g., tungsten, nitride, or polysilicon) and inter-gate insulator material (e.g., oxide or silicon dioxide). As depicted, the layers of control gate material include layer 417 and layers 414-416 and the layers of inter-gate insulator material include layers 418-420. The inter-gate insulator material layer 420 may be arranged above a source line layer 422 (e.g., doped polysilicon) that may be arranged above a substrate 424 (e.g., a silicon substrate). In some cases, a first word line (WL1) may correspond with control gate layer 414, a second word line (WL0) may correspond with control gate layer 415, and a source-side select gate line (SGS) may correspond with control gate layer 416.

In one embodiment, within the memory hole a tunneling layer material 408 (e.g., including a thin oxide), a floating gate material 410 (e.g., polysilicon), a dielectric layer 412 (e.g., oxide), and a channel layer material 406 (e.g., undoped polysilicon) may be deposited within the memory hole and arranged in order to form the inverted NAND string. As depicted in FIG. 4A, the tunneling layer material 408 is arranged within or inside of the memory hole. The tunneling layer material 408 may comprise a portion of a multi-layer dielectric stack such as an ONO dielectric stack, which includes alternating layers of silicon dioxide ("O") and silicon nitride ("N"). In some cases, the tunneling layer material 408 may comprise a high-K dielectric material (e.g., hafnium-based high-K dielectrics or hafnium oxide) that has a dielectric constant that is greater than that of silicon dioxide. In some cases, a core material layer 404 (e.g., oxide) may be formed within the memory hole. In other cases, the core material layer 404 may be omitted. A bit line contact layer 402 may be formed at the top of the memory hole and connect to or directly abut the channel layer material 406. The channel layer material 406 may connect to the source line layer 422 at the bottom of the memory hole. Thus, in this case, the bit line contact layer 402 connects to the inverted NAND string at the top of the memory hole and the source line contact layer 422 connects to the inverted NAND string at the bottom of the memory hole.

In one embodiment, the bit line contact layer 402 may comprise a material of a first conductivity type (e.g., n-type) and the source line contact layer 422 may comprise a material of a second conductivity type different from the first conductivity type (e.g., p-type). In one example, the bit line contact layer 402 may comprise an n-type material (e.g., n-type polysilicon) and the source line contact layer 422 may comprise a p-type material (e.g., p-type polysilicon). In another example, the bit line contact layer 402 may comprise a p-type material and the source line contact layer 422 may comprise an n-type material (e.g., n-type polysilicon). Thus, in some cases, the inverted NAND string may include an asymmetric source and drain that may be used to provide both an electron supply (via the n-type material) and a hole supply (via the p-type material) for memory operations (e.g., program, erase, and read operations) performed using the inverted NAND string. The memory operations may comprise n-channel operations and/or p-channel operations depending on the bias conditions applied to the inverted NAND string.

In one embodiment, an inverted NAND string may be formed using a core material layer (e.g., an oxide layer or other dielectric layer) that is arranged adjacent to a channel layer (e.g., an undoped polysilicon channel layer) that is arranged adjacent to a blocking layer (e.g., an oxide layer or other dielectric layer) that is arranged adjacent to a floating gate layer (or a charge trap layer) that is arranged adjacent to a tunneling layer (e.g., a thin oxide) that is arranged adjacent to a control gate layer (e.g., tungsten). The tunneling layer may have a thickness that is less than the thickness of the blocking layer.

Figure 4B:
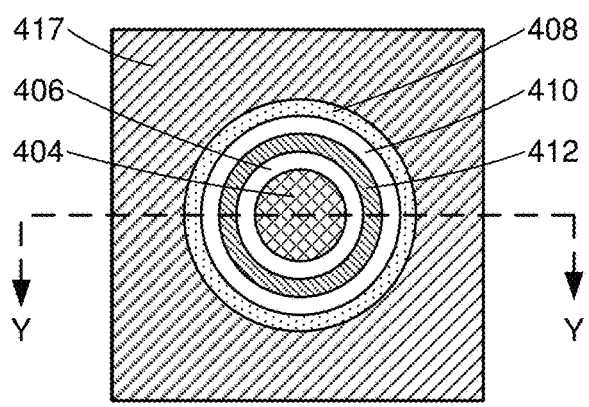
FIG. 4B depicts one embodiment of a cross-sectional view taken along line X-X of FIG. 4A.

FIG. 4B depicts one embodiment of a cross-sectional view taken along line X-X of FIG. 4A. As depicted, the inverted NAND string includes an inner core material layer 404 that is surrounded by the channel layer material 406 that is surrounded by the dielectric layer 412 that is surrounded by the floating gate material 410 that is surrounded by the tunneling layer material 408 that is surrounded by the control gate material layer 417. In one embodiment, FIG. 4A may depict a cross-sectional view taken along line Y-Y of FIG. 4B. In one embodiment, the inverted NAND string may be formed using a vertical cylindrical structure or a vertical tapered cylindrical structure. In this case, the dielectric material 412, floating gate material 410, tunneling layer material 408, and channel layer material 406 of the inverted NAND string may comprise vertical annular structures surrounding the core material layer 404. In another embodiment, the inverted NAND string may be formed using a vertical pillar structure or a vertical rectangular prism structure.

In some embodiments, a vertical NAND structure may include a vertical NAND string formed above a substrate and oriented such that the vertical NAND string is orthogonal to the substrate. The vertical NAND string may be arranged within a vertical memory hole that is etched through alternating layers of control gate material (e.g., tungsten or polysilicon) and inter-gate insulator material (e.g., oxide or silicon oxide).

Figure 5:
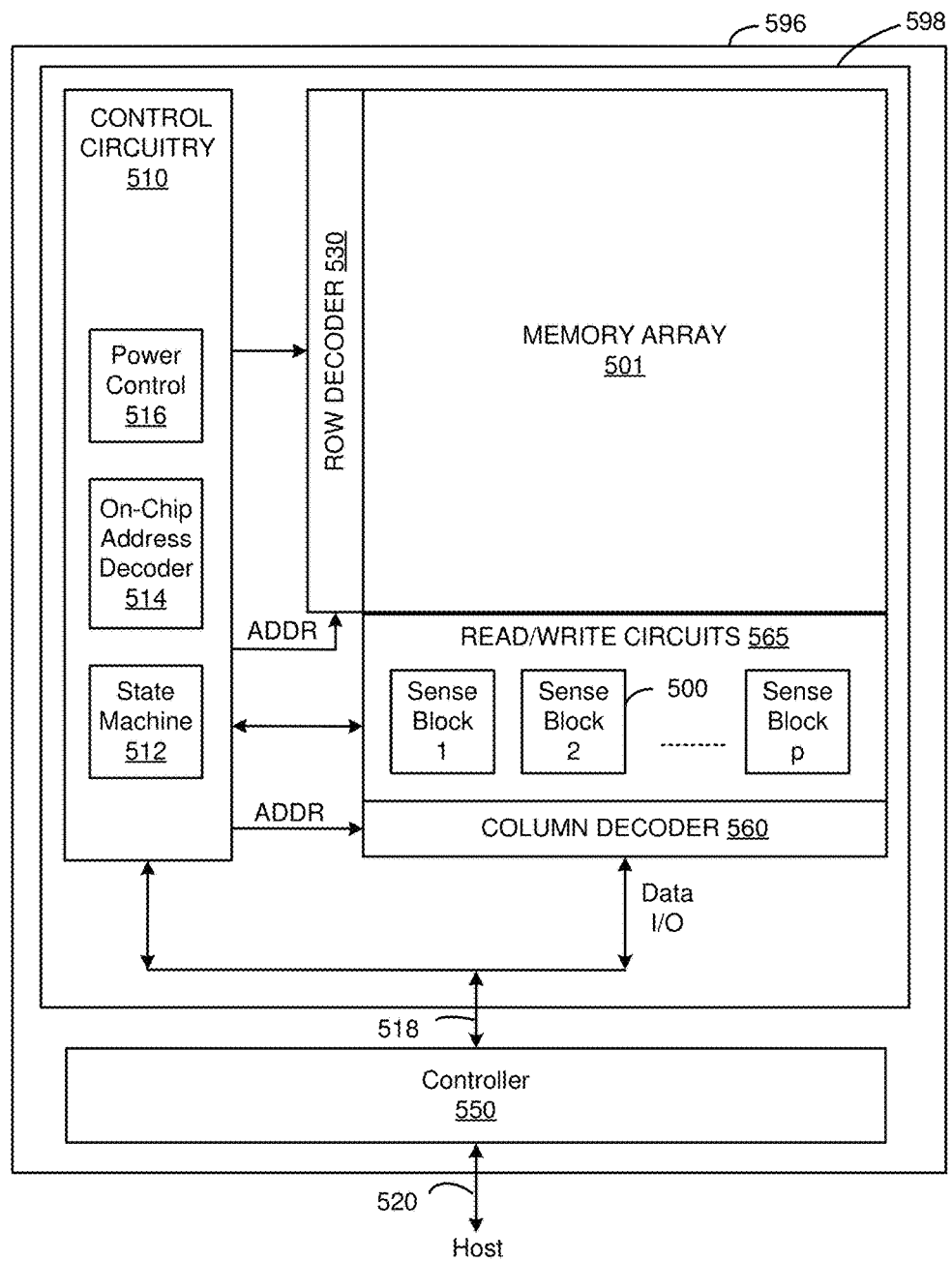
FIG. 5 depicts one embodiment of a non-volatile storage system.

FIG. 5 depicts one embodiment of a non-volatile storage system 596 including read/write circuits for reading and programming a page (or other unit) of memory cells (e.g., NAND multi-level cells) in parallel. As depicted, non-volatile storage system 596 includes a memory die 598 and controller 550. Memory die 598 includes a memory array 501 (e.g., a NAND flash memory array), control circuitry 510, row decoder 530, column decoder 560, and read/write circuits 565. In one embodiment, access to the memory array 501 by the various peripheral circuits (e.g., row decoders or column decoders) is implemented in a symmetric fashion, on opposite sides of the array, so that the densities of access lines and circuitry on each side are reduced by half. The memory array 501 is addressable by word lines via a row decoder 530 and by bit lines via a column decoder 560. Word lines and bit lines are examples of memory array control lines. The read/write circuits 565 include multiple sense blocks 500 that allow a page of storage elements to be read or programmed in parallel. In some cases, controller 550 may be integrated on the memory die 598. Commands and data are transferred between the host and controller 550 via lines 520 and between the controller 550 and the memory die 598 via lines 518.

The control circuitry 510 cooperates with the read/write circuits 565 to perform memory operations on the memory array 501. The control circuitry 510 includes a state machine 512, an on-chip address decoder 514, and a power control module 516. The state machine 512 provides chip-level control of memory operations. The on-chip address decoder 514 provides an address interface between the addresses used by the host and the hardware addresses used by the decoders 530 and 560. The power control module 516 controls the power and voltages supplied to the word lines and bit lines during memory operations. In one embodiment, a power control module 516 includes one or more charge pumps that may generate voltages greater than the supply voltage.

In some embodiments, one or more of the components (alone or in combination), other than memory array 501, may be referred to as a managing or control circuit. For example, one or more managing or control circuits may include any one of or a combination of control circuitry 510, state machine 512, decoders 530/560, power control 516, sense blocks 500, read/write circuits 565, controller 550, and so forth. The one or more managing circuits or the one or more control circuits may perform or facilitate one or more memory array operations including erasing, programming, or reading operations.

In some embodiments, one or more managing or control circuits may be used for controlling the operation of a memory array, such as memory array 501. The one or more managing or control circuits may provide control signals to the memory array in order to perform a read operation and/or a write operation on the memory array. In one example, the one or more managing or control circuits may include any one of or a combination of control circuitry, state machine, decoders, sense amplifiers, read/write circuits, and/or controllers. The one or more control circuits may enable or facilitate one or more memory array operations including erasing, programming, or reading operations to be performed on the memory array. In one example, the one or more control circuits may comprise an on-chip memory controller for determining row and column addresses, word line and bit line addresses, memory array enable signals, and/or data latching signals.

In one embodiment, memory array 501 may be divided into a large number of blocks (e.g., blocks 0-1023, or another amount) of memory cells. As is common for flash memory systems, the block may be the unit of erase. That is, each block may contain the minimum number of memory cells that are erased together. Other units of erase can also be used. A block contains a set of NAND strings which are accessed via bit lines and word lines. Typically, all of the NAND strings in a block share a common set of word lines.

Each block may be divided into a particular number of pages. In one embodiment, a page may be the unit of programming. Other units of programming can also be used. One or more pages of data are typically stored in one row of memory cells. For example, one or more pages of data may be stored in memory cells connected to a common word line. In one embodiment, the set of memory cells that are connected to a common word line are programmed simultaneously. A page can store one or more sectors. A sector may include user data and overhead data (also called system data). Overhead data typically includes header information and Error Correction Codes (ECC) that have been calculated from the user data of the sector. The controller (or other component) calculates the ECC when data is being programmed into the array, and also checks it when data is being read from the array. Alternatively, the ECC and/or other overhead data may be stored in different pages, or even different blocks, than the user data to which they pertain. A sector of user data is typically 512 bytes, corresponding to the size of a sector in magnetic disk drives. A large number of pages form a block, anywhere from 8 pages, for example, up to 32, 64, 128 or more pages. Different sized blocks, pages, and sectors can also be used.

Figure 6:
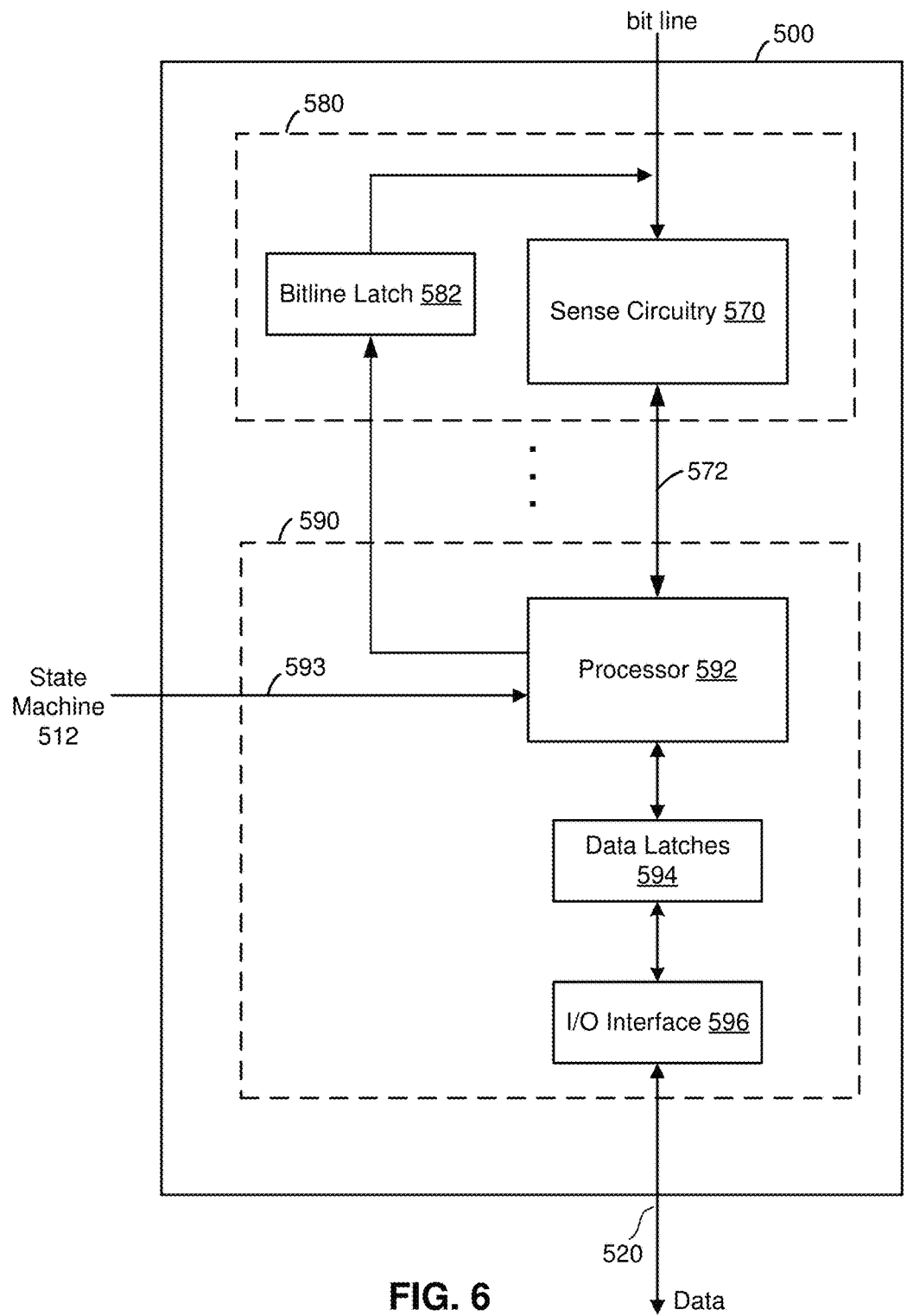
FIG. 6 depicts one embodiment of a sense block.

FIG. 6 depicts one embodiment of a sense block 500, such as sense block 500 in FIG. 5. An individual sense block 500 may be partitioned into a core portion, referred to as a sense module 580, and a common portion 590. In one embodiment, there is a separate sense module 580 for each bit line and one common portion 590 for a set of multiple sense modules 580. In one example, a sense block will include one common portion 590 and eight sense modules 580. Each of the sense modules in a group will communicate with the associated common portion via a data bus 572.

Sense module 580 comprises sense circuitry 570 that determines whether a conduction current in a connected bit line is above or below a predetermined threshold level. Sense module 580 also includes a bit line latch 582 that is used to set a voltage condition on the connected bit line. For example, a predetermined state latched in bit line latch 582 may result in the connected bit line being pulled to a state designating program inhibit voltage (e.g., 1.5-3 V).

Common portion 590 comprises a processor 592, a set of data latches 594, and an I/O Interface 596 coupled between the set of data latches 594 and data bus 520. Processor 592 performs computations. For example, processor 592 may determine the data stored in the sensed storage element and store the determined data in the set of data latches. The set of data latches 594 may be used to store data bits determined by processor 592 during a read operation or to store data bits imported from the data bus 520 during a program operation. The imported data bits represent write data meant to be programmed into a memory array, such as memory array 501 in FIG. 5. I/O interface 596 provides an interface between data latches 594 and the data bus 520.

During a read operation or other storage element sensing operation, a state machine, such as state machine 512 in FIG. 5, controls the supply of different control gate voltages to the addressed storage elements. As it steps through the various predefined control gate voltages corresponding to the various memory states supported by the memory, the sense module 580 may trip at one of these voltages and an output will be provided from sense module 580 to processor 592 via bus 572. At that point, processor 592 determines the resultant memory state by consideration of the tripping event(s) of the sense module and the information about the applied control gate voltage from the state machine via input lines 593. It then computes a binary encoding for the memory state and stores the resultant data bits into data latches 594. In another embodiment of the core portion, bit line latch 582 serves both as a latch for latching the output of the sense module 580 and as a bit line latch as described above.

During a programming operation, the data to be programmed is stored in the set of data latches 594. The programming operation, under the control of the state machine 512, comprises a series of programming voltage pulses applied to the control gates of the addressed storage elements. Each program pulse is followed by a read back (or verify process) to determine if the storage element has been programmed to the desired memory state. Processor 592 monitors the read back memory state relative to the desired memory state. When the two are in agreement, the processor 592 sets the bit line latch 582 so as to cause the bit line to be pulled to a state designating program inhibit voltage. This inhibits the storage element coupled to the bit line from further programming even if program pulses appear on its control gate. In other embodiments, the processor initially loads the bit line latch 582 and the sense circuitry sets it to an inhibit value during the verify process.

Data latch stack 594 contains a stack of data latches corresponding to the sense module. In one embodiment, there are three data latches per sense module 580. The data latches can be implemented as a shift register so that the parallel data stored therein is converted to serial data for data bus 520, and vice-versa. All the data latches corresponding to a read/write block can be linked together to form a block shift register so that a block of data can be input or output by serial transfer. In particular, the bank of read/write modules may be configured such that each of its set of data latches will shift data in to or out of the data bus in sequence as if they are part of a shift register for the entire read/write block.

Figure 7A:
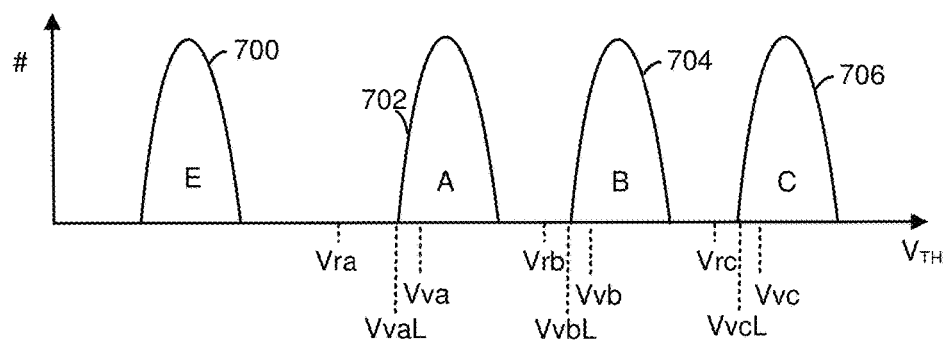
FIG. 7A depicts one embodiment of a set of threshold voltage distributions for a four-state memory device in which each storage element stores two bits of data.

FIG. 7A depicts one embodiment of a set of threshold voltage distributions for a four-state memory device in which each storage element stores two bits of data. A first threshold voltage (Vth) distribution 700 is provided for erased (E-state) storage elements. Three Vth distributions 702, 704 and 706 represent programmed states A, B and C, respectively. In one embodiment, the threshold voltages in the E-state and the threshold voltages in the A, B and C distributions are positive. In another embodiment, the threshold voltage distribution for the E-state is negative, while the threshold voltage distributions for the A-state, B-state and C-state distributions are positive.

Three read reference voltages, Vra, Vrb and Vrc, are also provided for reading data from storage elements. By testing whether the threshold voltage of a given storage element is above or below Vra, Vrb and Vrc, the system can determine the state, e.g., programming condition, the storage element is in.

Further, three verify reference voltages, Vva, Vvb and Vvc, are provided. When programming storage elements to the A-state, B-state or C-state, the system will test whether those storage elements have a threshold voltage greater than or equal to Vva, Vvb or Vvc, respectively.

In one embodiment, known as full sequence programming, storage elements can be programmed from the E-state directly to any of the programmed states A, B or C. For example, a population of storage elements to be programmed may first be erased so that all storage elements in the population are in the E-state. A series of program pulses, such as depicted in FIG. 7F, may then be used to program storage elements directly into states A, B or C. While some storage elements are being programmed from the E-state to the A-state, other storage elements are being programmed from the E-state to the B-state and/or from the E-state to the C-state.

Another option is to use low and high verify levels for one or more data states. For example, VvaL and Vva are lower and higher verify levels, respectively, for the A-state, VvbL and Vvb are lower and higher verify levels, respectively, for the B-state, and VvcL and Vvc are lower and higher verify levels, respectively, for the C-state. In some cases, VvcL is not used since reduced programming precision may be acceptable for the highest state. During programming, when the Vth of a storage element which is being programmed to the A-state as a target state exceeds VvaL, the programming speed of the storage element is slowed down, in a slow programming mode, such as by raising the associated bit line voltage to a level, e.g., 0.6-0.8 V, which is between a nominal program or non-inhibit level, e.g., 0 V and a full inhibit level, e.g., 4-6 V. This provides greater accuracy by avoiding large step increases in threshold voltage. When the Vth reaches Vva, the storage element is locked out from further programming. Similarly, when the Vth of a storage element which is being programmed to the B-state as a target state exceeds VvbL, the programming speed of the storage element is slowed down, and when the Vth reaches Vvb, the storage element is locked out from further programming. Optionally, when the Vth of a storage element which is being programmed to the C-state as a target state exceeds VvcL, the programming speed of the storage element is slowed down, and when the Vth reaches Vvc, the storage element is locked out from further programming. This programming technique has been referred to as a quick pass write or dual verify technique. Note that, in one approach, dual verify levels are not used for the highest state since some overshoot is typically acceptable for that state. Instead, the dual verify levels can be used for the programmed states, above the erased state, and below the highest state.

Figure 7B:
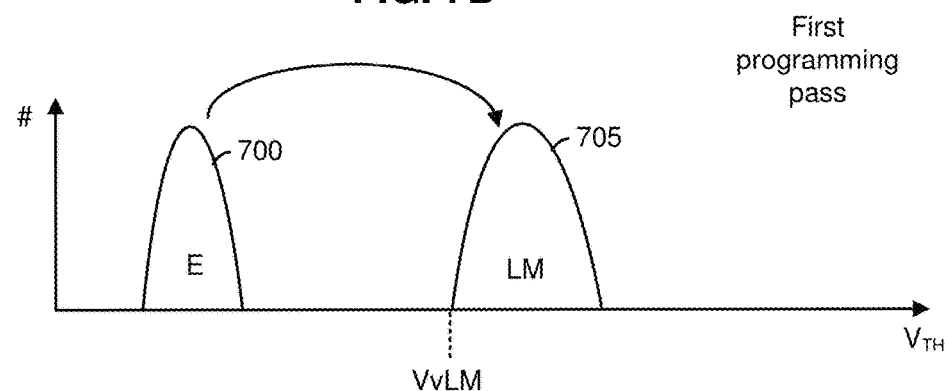
FIG. 7B depicts one embodiment of a first pass of a two-pass programming technique.

FIG. 7B depicts one embodiment of a first pass of a two-pass programming technique. In this example, a multi-state storage element stores data for two different pages: a lower page and an upper page. Four states are depicted by repeating the threshold voltage distributions 700, 702, 704 and 706 from FIG. 7A. These states, and the bits they represent, are: E-state (11), A-state (01), B-state (00) and C-state (10). For E-state, both pages store a "1." For A-state, the lower page stores a "1" and the upper page stores a "0." For B-state, both pages store "0." For C-state, the lower page stores "0" and the upper page stores "1." Note that although specific bit patterns have been assigned to each of the states, different bit patterns may also be assigned.

In the first programming pass, the lower page is programmed for a selected word line WLn. If the lower page is to remain data 1, then the storage element state remains at state E (distribution 700). If the data is to be programmed to 0, then the threshold voltage of the storage elements on WLn are raised such that the storage element is programmed to an intermediate (LM or lower-middle) state (distribution 705).

In one embodiment, after a storage element is programmed from the E-state to the LM-state, its neighbor storage element on an adjacent word line WLn+1 in the NAND string will then be programmed with respect to its lower page in a respective first programming pass of the adjacent word line.

Figure 7C:
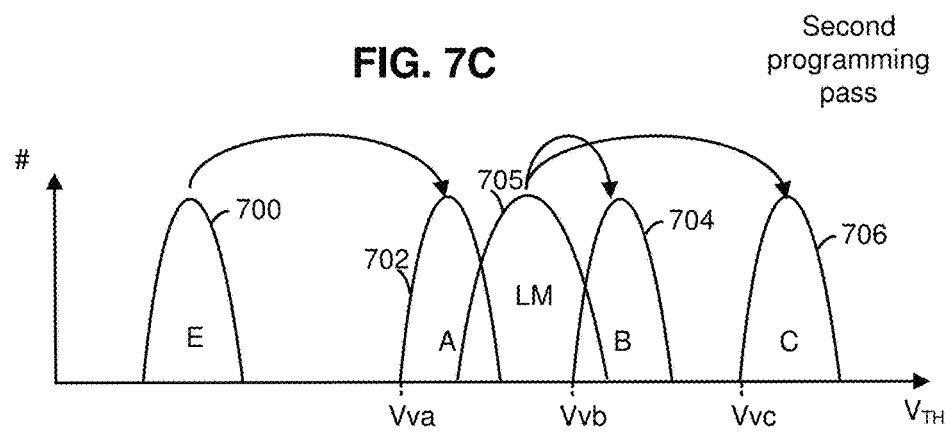
FIG. 7C depicts one embodiment of a second pass of the two-pass programming technique referred to in FIG. 7B.

FIG. 7C depicts one embodiment of a second pass of the two-pass programming technique referred to in FIG. 7B. The A-state storage elements are programmed from the E-state distribution 700 to the A-state distribution 702, the B-state storage elements are programmed from the LM-state distribution 705 to the B-state distribution 704, and the C-state storage elements are programmed from the LM-state distribution 705 to the C-state distribution 706.

Figure 7D:
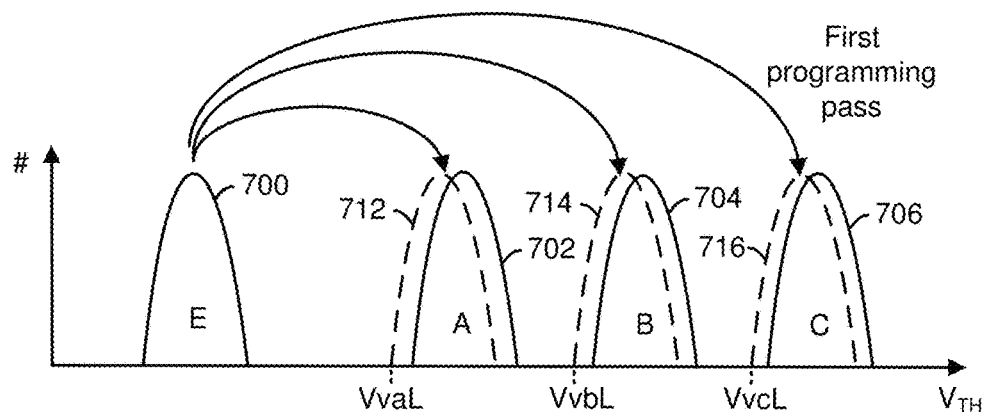
FIG. 7D depicts one embodiment of a first pass of another two-pass programming technique.

FIG. 7D depicts one embodiment of a first pass of another two-pass programming technique. In this example, referred to as foggy-fine (or course-fine) programming, the A-state, B-state and C-state storage elements are programmed from the E-state to distributions 712, 714 and 716, respectively, using lower verify levels VvaL, VvbL and VvcL, respectively. This is the foggy (or course) programming pass. A relatively large program voltage step size may be used, for instance, to quickly program the storage elements to the respective lower verify levels.

Figure 7E:
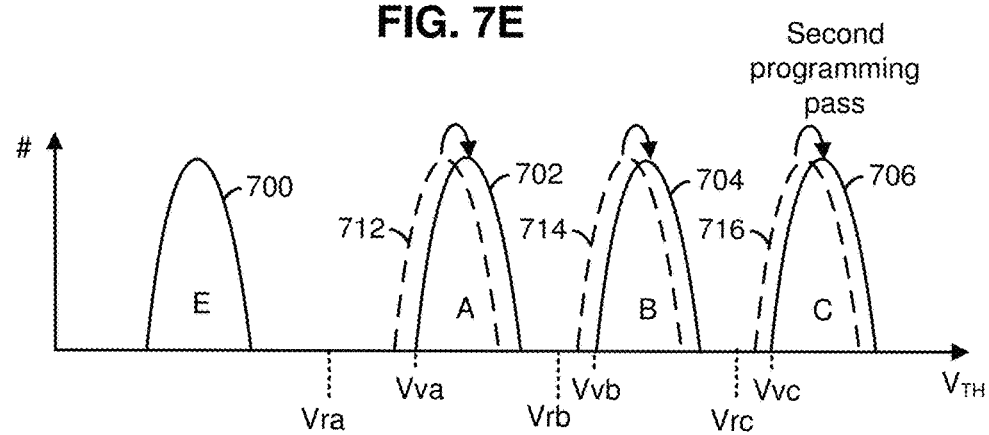
FIG. 7E depicts one embodiment of a second pass of the two-pass programming technique referred to in FIG. 7D.
Figure 7F:
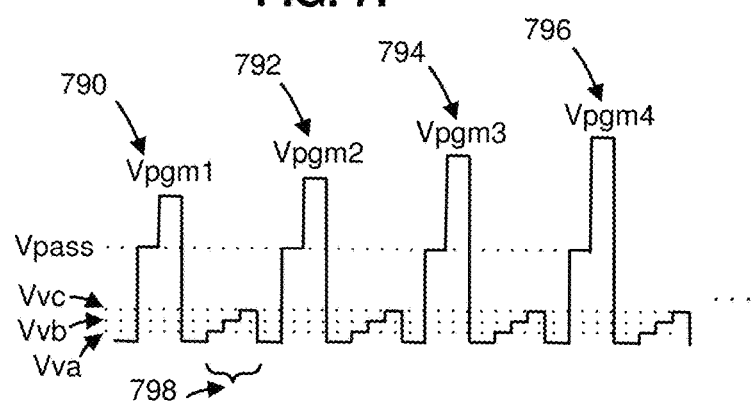
FIG. 7F depicts one embodiment of a series of program and verify pulses which are applied to a selected word line during a programming operation.

FIG. 7E depicts one embodiment of a second pass of the two-pass programming technique referred to in FIG. 7D. The A-state, B-state and C-state storage elements are programmed from the respective lower distributions to respective final distributions 702, 704 and 706, respectively, using the nominal, higher verify levels Vva, Vvb and Vvc, respectively. This is the fine programming pass. A relatively small program voltage step size may be used, for instance, to slowly program the storage elements to the respective final verify levels while avoiding a large overshoot. The programmed data states corresponding with the final distributions 702, 704 and 706 may be referred to as final programmed data states. The final programmed data state for a memory cell may correspond with the targeted threshold voltage or the targeted threshold voltage distribution for the memory cell. In some cases, the programmed data states corresponding with the final distributions 702, 704 and 706 may be referred to as target data states or intended programming data states.

Although the programming examples depict four data states and two pages of data, the concepts described herein may be applied to other implementations with more or fewer than four states and more or fewer than two pages. For example, memory devices may utilize eight or sixteen states per storage element. Moreover, in the example programming techniques discussed herein, the Vth of a storage element may be raised gradually as it is programmed to a target data state. However, programming techniques may be used in which the Vth of a storage element may be lowered gradually as it is programmed to a target data state. Programming techniques which measure storage element current may be used as well. The concepts described herein may be adapted to the different programming techniques.

FIG. 7F depicts one embodiment of a series of program and verify pulses which are applied to a selected word line during a programming operation. A programming operation may include multiple program-verify iterations, in which each iteration applies one or more programming voltages followed by one or more verify voltages to the selected word line. In one embodiment, the programming voltages applied in a previous iteration may be stepped up in successive iterations. Moreover, the one or more programming voltages applied during a programming iteration may include a first portion which has a pass voltage (Vpass) level, e.g., 6-8 V, followed by a second, highest amplitude portion at a program level, e.g., 12-25 V. For example, a first, second, third and fourth programming pulses 790, 792, 794 and 796 have program levels of Vpgm1, Vpgm2, Vpgm3 and Vpgm4, respectively. One or more verify pulses 798 associated with verify voltages Vva, Vvb and Vvc may be provided after each programming pulse. In some cases, one or more initial programming pulses are not followed by verify pulses because it is not expected that any storage elements have reached the lowest program state (e.g., A-state). Subsequently, in some cases, program iterations may use verify pulses for the A-state, followed by program iterations which use verify pulses for the A-states and B-states, followed by program iterations which use verify pulses for the B-states and C-states.

In one embodiment, a programming pulse may correspond with a voltage that is applied to a selected word line connected to a selected memory cell within a memory array during a programming operation that transitions from a first voltage (e.g., 0V) to an intermediate voltage (e.g., Vpass) then transitions from the intermediate voltage to a programming voltage (e.g., Vpgm1 or 15V). A program verify pulse may correspond with a voltage that is applied to a selected word line connected to a selected memory cell within a memory array during a program verify operation that transitions from a first voltage (e.g., 0V) to first verify voltage (e.g., Vva) and then transitions from the first verify voltage to a second verify voltage (e.g., Vvb).

Figure 8A:
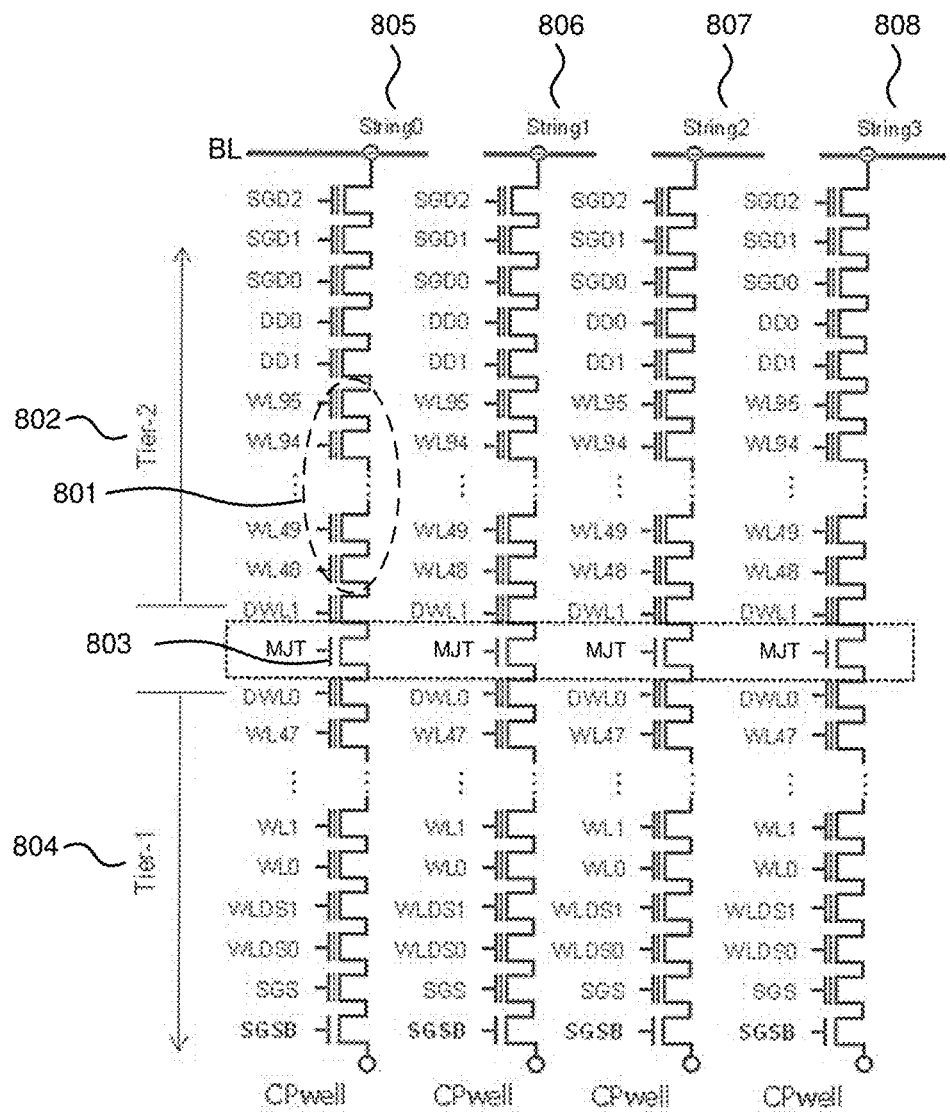
FIG. 8A depicts one embodiment of four NAND strings.

FIG. 8A depicts one embodiment of four NAND strings 805-808. Each of the NAND strings comprises a first portion of the NAND string (e.g., corresponding with a first tier of memory cell transistors 804), a second portion of the NAND string (e.g., corresponding with a second tier of memory cell transistors 802), and a tier select gate transistor 803 arranged between the first portion of the NAND string and the second portion of the NAND string. The first portion of the NAND string includes memory cell transistors corresponding with word lines WL0-WL47, a memory cell transistor connected to dummy word line DWL0 and arranged between the tier select gate transistor 803 and the memory cell transistor connected to word line WL47, and memory cell transistors connected to dummy word lines WLDS1 and WLDS0 and arranged between the memory cell transistor connected to word line WL0 and the source-side select gate connected to SGS.

In one embodiment, during a programming operation for memory cells within the first tier 804, the tier select gate transistor 803 may be placed into a conducting state while the memory cells within the first tier 804 are programmed. During a subsequent programming operation for memory cells within the second tier 802, the tier select gate transistor 803 may be placed into a non-conducting state while the memory cells 801 within the second tier 802 are programmed. In this case, the channel under the memory cells within the first tier 804 may be floated. The tier select gate transistor 803 may comprise an NMOS transistor without a charge trap layer between the channel of the NMOS transistor and the gate of the NMOS transistor. In another embodiment, during an erase operation for memory cells within the second tier 802, the tier select gate transistor 803 may be placed into a non-conducting state while the memory cells within the second tier 802 are erased.

Figure 8B:
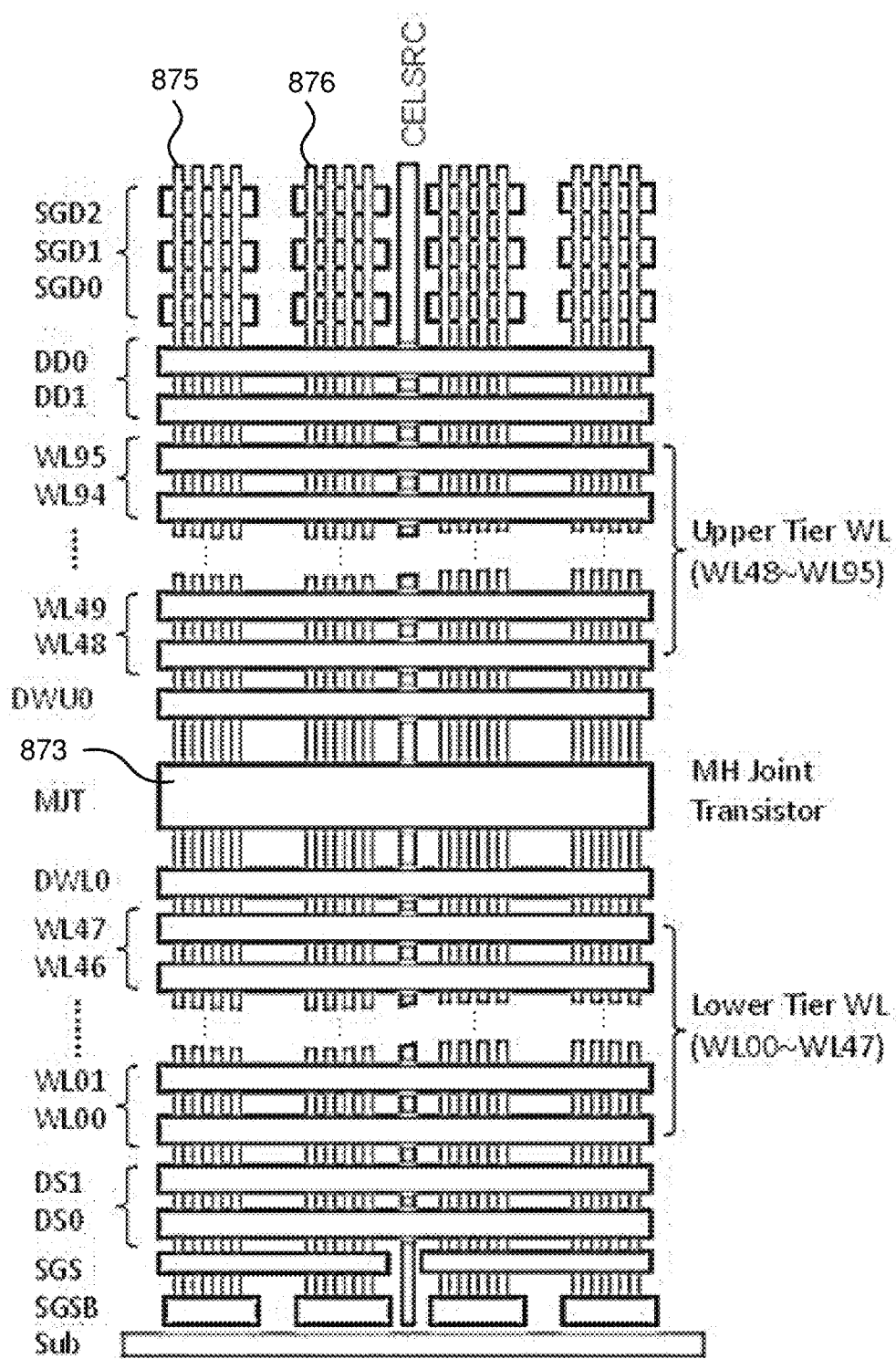
FIG. 8B depicts one embodiment of a NAND structure that includes four groups of memory strings.

FIG. 8B depicts one embodiment of a NAND structure that includes four groups of memory strings (including a first group 875 comprising four NAND strings and a second group 876 comprising four NAND strings). Each memory string includes a tier select gate transistor (or memory hole joint transistor) that may be used to electrically isolate a first set of memory cell transistors within the memory string (e.g., corresponding with the lower tier word lines WL00-WL47) from a second set of memory cell transistors within the memory string (e.g., corresponding with the upper tier word lines WL48-WL95) during a memory operation (e.g., an erase operation or a programming operation). The tier select gate transistors 873 may comprise programmable transistors, such as floating gate transistors or charge trap transistors, or non-programmable transistors, such as an NMOS transistor or a PMOS transistor. When a tier select gate transistor is set into a conducting state, then a bit line connected to a drain-side of a NAND string may be electrically connected to a channel formed under memory cell transistors of the lower tier. Each memory string within the four groups of memory strings may be connected to a different bit line.

Figure 8C:
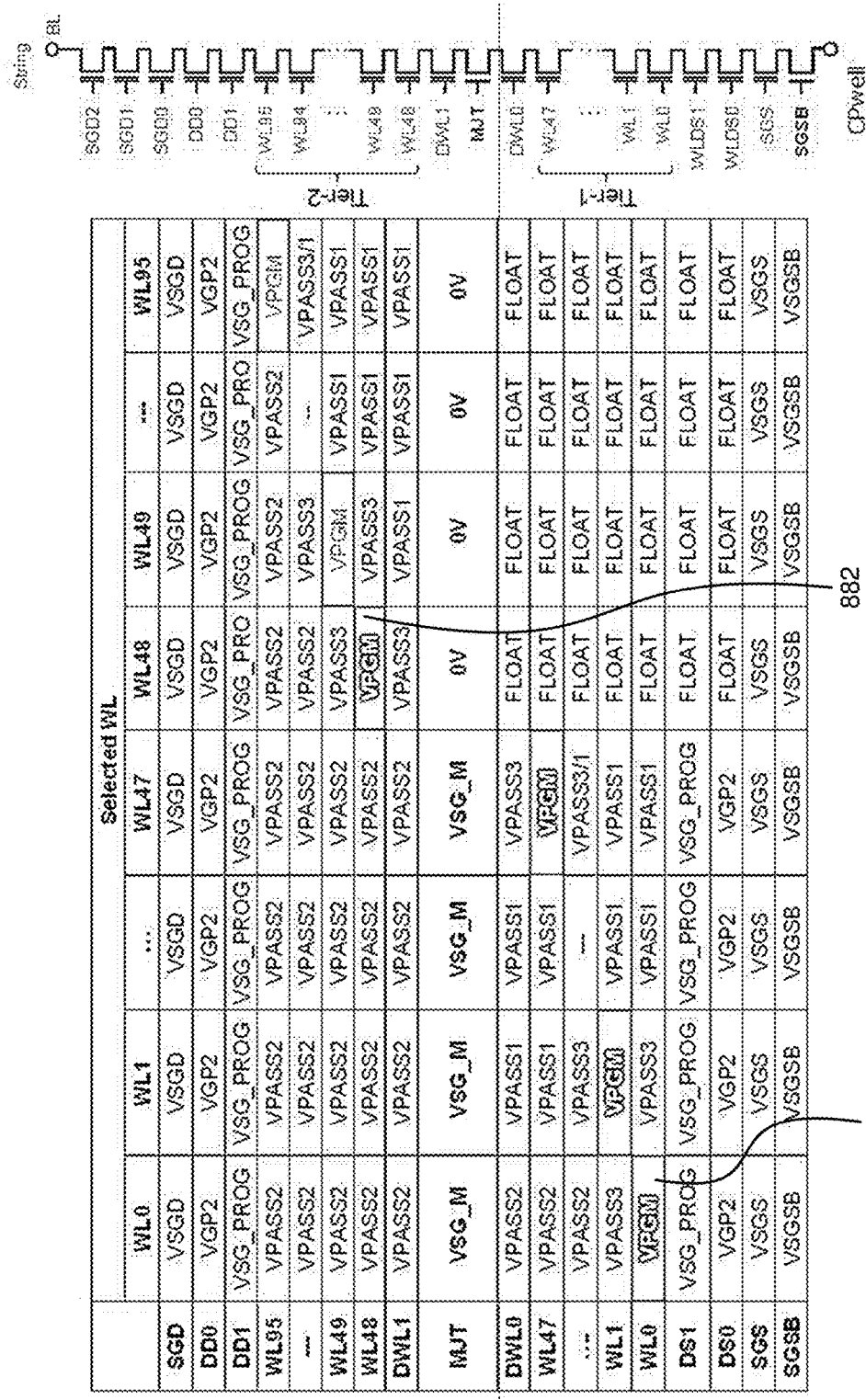
FIG. 8C depicts one embodiment of biasing conditions applied to word lines of a NAND structure that includes one or more tier select gate transistors.

FIG. 8C depicts one embodiment of biasing conditions applied to word lines of a NAND structure that includes one or more tier select gate transistors. As depicted, when programming 881 a memory cell within a first tier associated with word line WL0, VPGM (e.g., 15V) is applied to WL0 while the tier select gate transistor is set into a conducting state (e.g., VSG_M of 7V) and pass voltages are applied to unselected word lines WL1 through WL95. When programming 882 a memory cell within a second tier associated with word line WL48, VPGM is applied to WL48 while the tier select gate transistor is set into a non-conducting state (e.g., the gate of the tier select gate transistor is driven to 0V) and pass voltages are applied to unselected word lines WL49 through WL95 within the second tier. In this case, the transistors within the first tier may be electrically disconnected from the transistors within the second tier and the memory cell transistors within the first tier may be floated.

In some embodiments, the order of programming and verifying memory cell transistors within the first tier may be from word line WL47 to word line WL0 (e.g., from the memory cell transistor closest to the tier select gate transistor on the source-side towards the source-side select gate transistor). In this case, the memory cell transistor connected to word line WL47 may be programmed and verified before the memory cell transistor connected to word line WL46 is programmed and verified; subsequently, the memory cell transistor connected to word line WL46 may be programmed and verified before the memory cell transistor connected to word line WL45 is programmed and verified.

In some embodiments, the order of programming and verifying memory cell transistors within the second tier may be from word line WL48 to word line WL95 (e.g., from the memory cell transistor closest to the tier select gate transistor on the drain-side towards the drain-side select gate transistor). In this case, the memory cell transistor connected to word line WL48 may be programmed and verified before the memory cell transistor connected to word line WL49 is programmed and verified; subsequently, the memory cell transistor connected to word line WL49 may be programmed and verified before the memory cell transistor connected to word line WL50 is programmed and verified.

In some cases, each NAND string may include a tier select gate transistor separating a top sub-block portion of the NAND string from a bottom sub-block portion of the NAND string. In this case, for the top sub-block, a programming sequence comprising application of programming and program verify pulses may be from the bottom of the top sub-block to the top of the top sub-block (e.g., from a memory cell transistor adjacent to the tier select gate transistor on the drain-side towards the drain-side select gate for the NAND string). For the bottom sub-block, the programming sequence may be from the top of the bottom sub-block to the bottom of the bottom sub-block (e.g., from a memory cell transistor adjacent to the tier select gate on the source-side towards the source-side select gate for the NAND string).

Figure 8D:
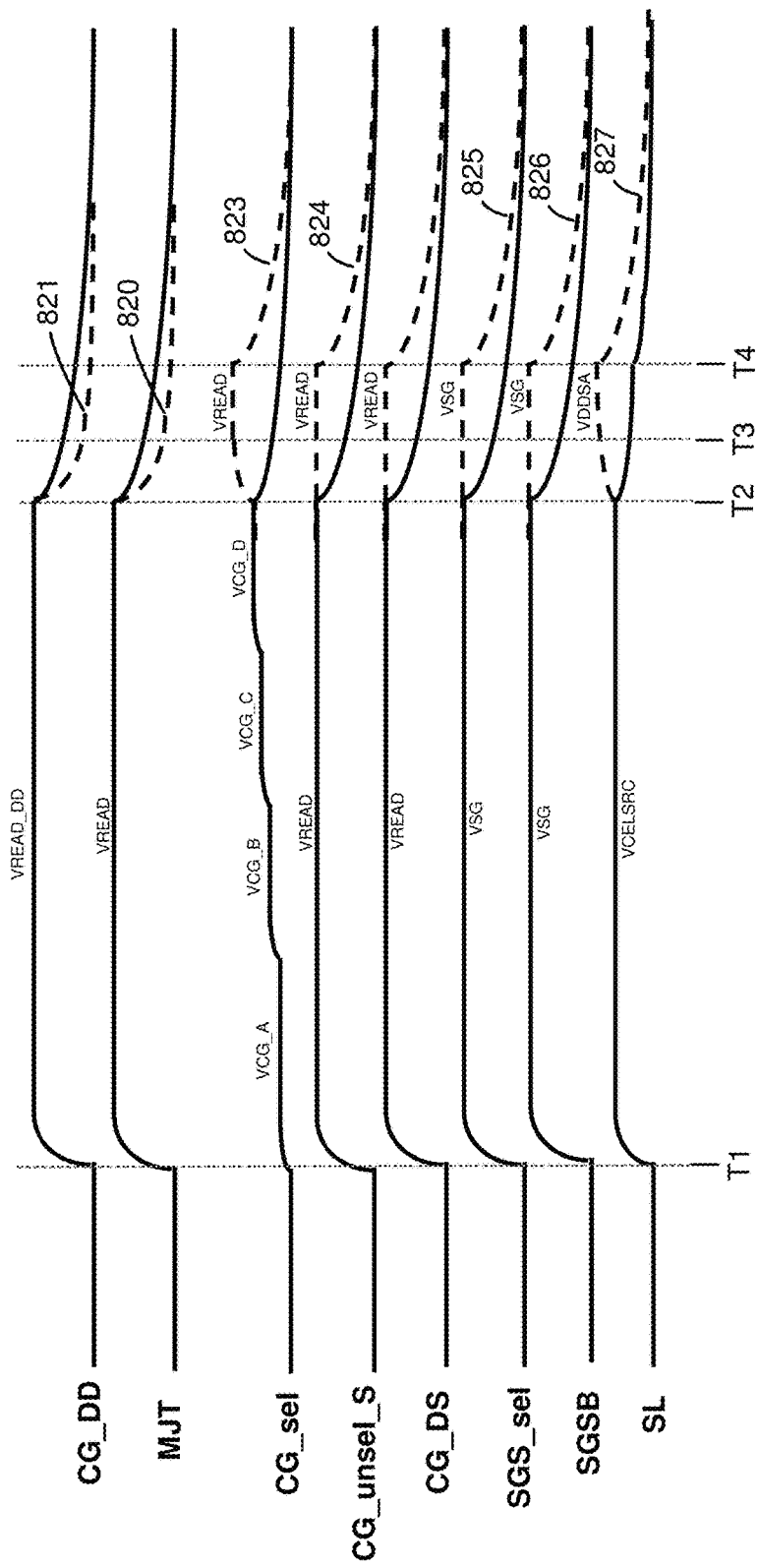
FIG. 8D depicts one embodiment of voltage waveforms applied to a NAND string during a program verify operation.

FIG. 8D depicts one embodiment of voltage waveforms applied to a NAND string during a program verify operation. For example, referring to FIG. 8A, waveform CG_DD 821 may be applied to the DD0 node, waveform MJT 820 may be applied to the MJT node, waveform CG_sel 823 may be applied to the gate of the select memory cell transistor (e.g., WL47), waveform CG_unsel_S 824 may be applied to the gates of one or more unselected memory cell transistors on the source-side of the selected memory cell transistor (e.g., WL46 and/or WL45), waveform CG_DS may be applied to the WLDS1 node, waveform SGS_sel 825 may be applied to the SGS node, waveform SGSB 826 may be applied to the SGSB node, and waveform SL 827 may be applied to a source line of a NAND string. As depicted, at time T1, a tier select gate transistor separating a top sub-block portion of a NAND string from a bottom sub-block portion of the NAND string is set into a conducting state by applying VREAD (e.g., 8V) to the gate of the tier select gate transistor. Between times T1 and T2, the voltage applied to the gate of the selected memory cell transistor is adjusted to verify various voltage levels (e.g., VCG_A, VCG_B, VCG_C, and VCG_D). At time T2, after the various voltage levels have been verified, the tier select gate transistor may be set into a non-conducting state and the gate of the selected memory cell transistor may be set to a voltage that is greater than any of the voltage levels used between times T1 and T2 (e.g., setting the gate of the selected memory cell transistor to a VREAD voltage above the highest verification voltage level VCG_D). Between times T3 and T4, all transistors between the selected memory cell transistor and the source line may be set into conducting states while the tier select gate transistor is in a non-conducting state. In this case, rather than deselecting the selected memory cell transistor at T2 after the various voltage levels have been verified, the channel under the transistors between the selected memory cell transistor and the source line may be biased or set to VDDSA (e.g., 2.7V or 3.3V) by applying voltage level VDDSA to the source line SL. The voltage level VDDSA (e.g., 3V) may be greater than any of the voltages (e.g., VCELSRC of 0.8V or 1.0V) applied to the source line SL between times T1 and T2.

Figure 8E:
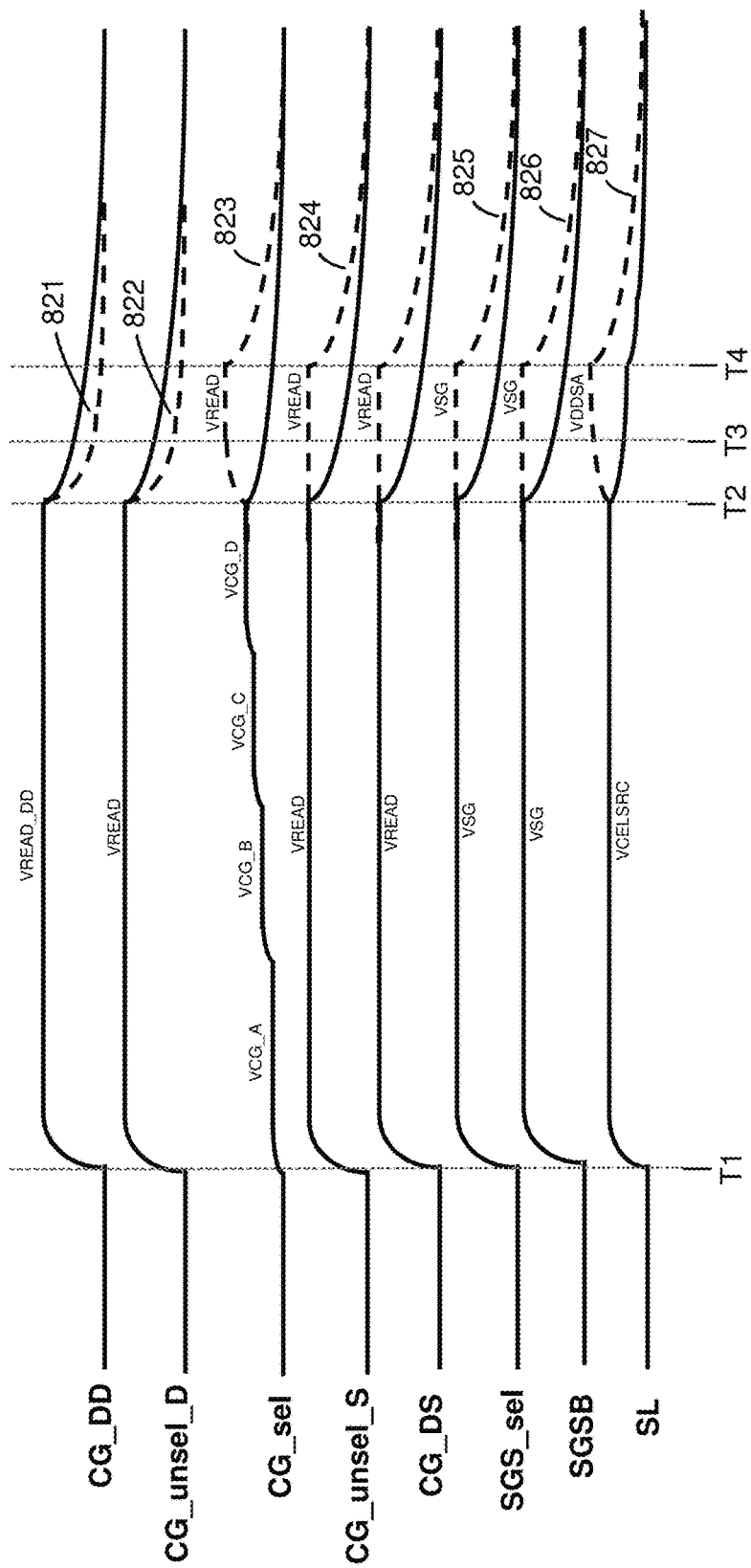
FIG. 8E depicts another embodiment of voltage waveforms applied to a NAND string during a program verify operation.

FIG. 8E depicts another embodiment of voltage waveforms applied to a NAND string during a program verify operation. For example, referring to FIG. 8A, waveform CG_DD 821 may be applied to the DD0 node, waveform CG_unsel_D 822 may be applied to gates of one or more unselected memory cell transistors on the drain-side of the selected memory cell transistor (e.g., WL94 and/or WL95), waveform CG_sel 823 may be applied to the gate of the select memory cell transistor (e.g., WL47), waveform CG_unsel_S 824 may be applied to the gates of one or more unselected memory cell transistors on the source-side of the selected memory cell transistor (e.g., WL1 and/or WL0), waveform CG_DS may be applied to the WLDS1 node, waveform SGS_sel 825 may be applied to the SGS node, waveform SGSB 826 may be applied to the SGSB node, and waveform SL 827 may be applied to a source line of a NAND string. As depicted, at time T1, a program verify operation is initiated by applying VREAD (e.g., 8V) to gates of the one or more unselected memory cell transistors on the drain-side of the selected memory cell transistor, VREAD to gates of the one or more unselected memory cell transistors on the source-side of the selected memory cell transistor, and VCG_A or another verify voltage level to the gate of the select memory cell transistor. Between times T1 and T2, the voltage applied to the gate of the selected memory cell transistor is adjusted to verify various voltage levels (e.g., VCG_A, VCG_B, VCG_C, and VCG_D). At time T2, after the various voltage levels have been verified, the one or more unselected memory cell transistors on the drain-side of the selected memory cell transistor are set into non-conducting states (e.g., CG_unsel_D 822 may be set to 0V) and the gate of the selected memory cell transistor may be set to a voltage that is greater than any of the voltage levels used between times T1 and T2 (e.g., setting the gate of the selected memory cell transistor to VREAD). Between times T3 and T4, all transistors between the selected memory cell transistor and the source line (including the one or more unselected memory cell transistors on the source-side of the selected memory cell transistor and the source-side select gates) may be set into conducting states while the one or more unselected memory cell transistors on the drain-side of the selected memory cell transistor are set into non-conducting states. In this case, rather than deselecting the selected memory cell transistor at T2 after the various voltage levels have been verified, the channel under the transistors between the selected memory cell transistor and the source line may be biased or set to VDDSA (e.g., 2.7V or 3.3V) by applying voltage level VDDSA to the source line SL. The voltage level VDDSA may be greater than any of the voltages applied to the source line SL between times T1 and T2.

In an alternative embodiment, after the various voltage levels have been verified, the one or more unselected memory cell transistors on the source-side of the selected memory cell transistor may be set into non-conducting states (e.g., CG_unsel_S 824 may be set to 0V) and the gate of the selected memory cell transistor may be set to a voltage that is greater than any of the voltage levels used between times T1 and T2 (e.g., setting the gate of the selected memory cell transistor to VREAD). The channel under the transistors between the selected memory cell transistor and a bit line may be biased or set to VDDSA (e.g., 2.7V or 3.3V) by applying voltage level VDDSA to the bit line BL. The voltage level VDDSA (e.g., 3.0V) may be greater than any of the voltages applied to the bit line BL between times T1 and T2 (e.g., the bit line may be set to 1.5V or VCELSRC+ 0.5V between times T1 and T2).

Figure 9A:
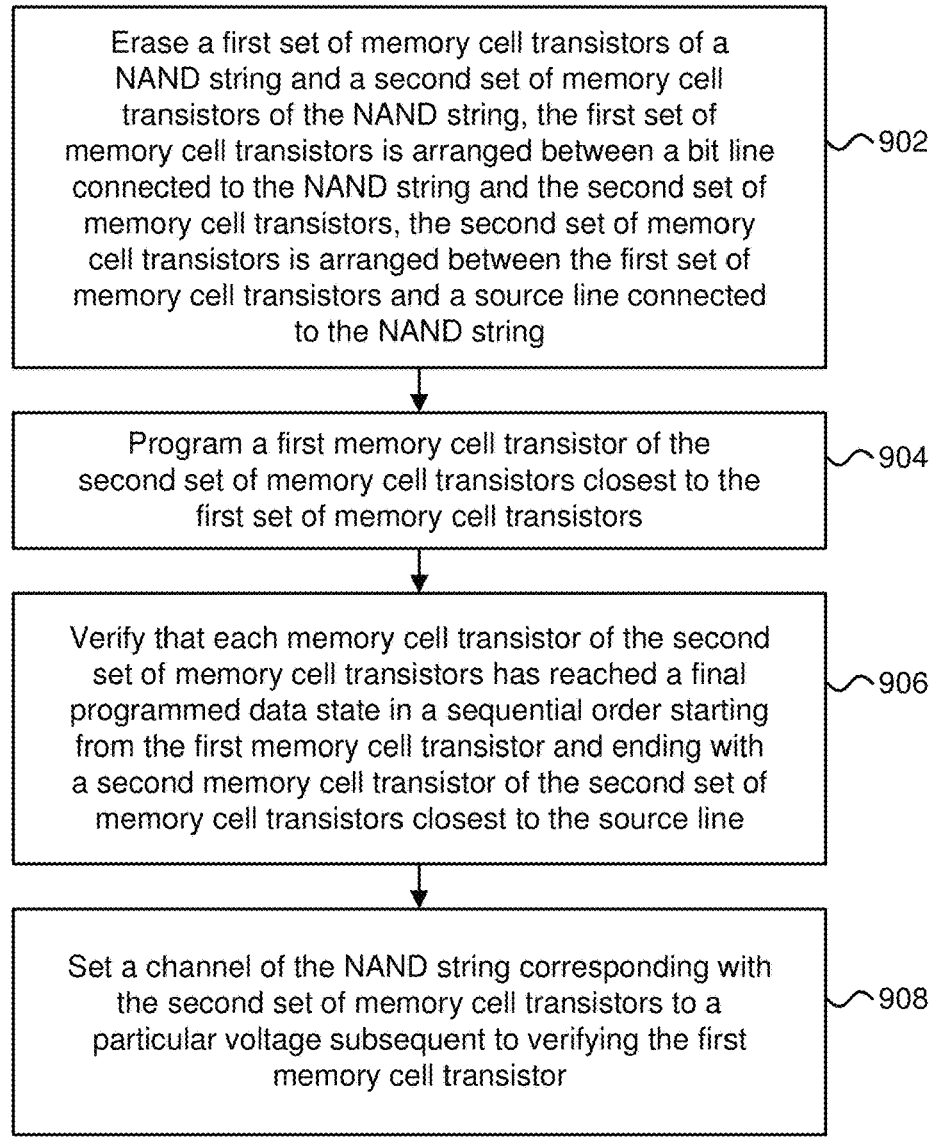
FIG. 9A is a flowchart describing one embodiment of a process for programming and verifying memory cells within a memory array.

FIG. 9A is a flowchart describing one embodiment of a process for programming and verifying memory cells within a memory array. In one embodiment, the process of FIG. 9A may be performed by a non-volatile storage system, such as non-volatile storage system 596 in FIG. 5A.

In step 902, a first set of memory cell transistors of a NAND string is erased and a second set of memory cell transistors of the NAND string is erased. In this case, the memory cells corresponding with the first set of memory cell transistors and the second set of memory cell transistors may be set into erased data states or within a threshold voltage distribution associated with the erased data state, such as the threshold voltage distribution 700 in FIG. 7A. The first set of memory cell transistors is arranged between a bit line connected to the NAND string and the second set of memory cell transistors. The second set of memory cell transistors is arranged between the first set of memory cell transistors and a source line connected to the NAND string. In one example, referring to FIG. 8A, the first set of memory cell transistors may correspond with the memory cell transistors connected to word lines WL48-WL95 and the second set of memory cell transistors may correspond with the memory cell transistors connected to word lines WL0-WL47. The second set of memory cell transistors may connect to the source line via a source-side select gate transistor. The first set of memory cell transistors may connect to the bit line via a drain-side select gate transistor.

In step 904, a first memory cell transistor of the second set of memory cell transistors closest to the first set of memory cell transistors is programmed. The first memory cell transistor may comprise a floating-gate transistor or a charge trap transistor. The first memory cell transistor may be programmed during a programming operation that comprises a series of one or more programming pulses and one or more verify pulses that are applied to a selected word line connected to the first memory cell transistor. In one example, referring to FIG. 8A, the memory cell transistor connected to word line WL47 may comprise the memory cell transistor out of the set of memory cell transistors connected to word lines WL0-WL47 that is closest to the set of memory cell transistors connected to word lines WL48-WL95. In some cases, the first memory cell transistor may be adjacent to a memory cell transistor of the first set of memory cell transistors (e.g., if no tier select gate transistors and internal dummy transistors are used within a NAND string). In step 906, it is verified that each memory cell transistor of the second set of memory cell transistors has reached a final programmed data state in a sequential order starting from the first memory cell transistor and ending with a second memory cell transistor of the second set of memory cell transistors closest to the source line. In one example, referring to FIG. 8A, the memory cell transistor connected to word line WL47 may be program verified prior to the memory cell transistor connected to word line WL46 being program verified and the memory cell transistor connected to word line WL46 may be program verified prior to the memory cell transistor connected to word line WL45 being program verified; subsequently, the memory cell transistor connected to word line WL1 may be program verified prior to the memory cell transistor connected to word line WL0 being program verified.

In step 908, a channel of the NAND string corresponding with the second set of memory cell transistors may be set to a particular voltage subsequent to verifying the first memory cell transistor of the second set of memory cell transistors. The particular voltage may be greater than the source line voltage applied to the source line while verifying the first memory cell transistor. The particular voltage may be applied subsequent to verification of the first memory cell transistor and prior to deselection of the first memory cell transistor and/or prior to the source line falling below the source line voltage applied to the source line while verifying the first memory cell transistor. In one example, referring to FIG. 8D and FIG. 8A, the channel under the memory cell transistors connected to word lines WL0-WL47 may be adjusted after program verifying the first memory cell transistor from VCELSRC (e.g., 0.8V) between times T1 and T2 to VDDSA (e.g., 3.0V) between times T3 and T4.

In some embodiments, during a programming operation, a first memory cell may be programmed and then program verified followed by a second memory cell that is programmed and then program verified. The programming operation may include the application of one or more programming pulses to the first memory cell followed by the application of one or more program verify pulses to the first memory cell. The application of one or more program verify pulses to the first memory cell may be used to confirm that the first memory cell has been programmed or set into a target data state or into the final programmed data state for the first memory cell.

In some embodiments, a NAND string may include 32 memory cell transistors. Each of the 32 memory cell transistors may be set into an erased data state during an erase operation. Subsequently, a first memory cell transistor (e.g., corresponding with word line 12) may be programmed and program verified while all the other 31 memory cell transistors remain in the erased data state. After the first memory cell transistor has been set into its intended data state or target data state, then a second memory cell transistor (e.g., corresponding with word line 11) may be programmed and program verified while all the other 30 memory cell transistors remain in the erased data state. Subsequently, a third memory cell transistor (e.g., corresponding with word line 8) may be programmed and program verified while all the other 29 memory cell transistors remain in the erased data state. Subsequently, a fourth memory cell transistor (e.g., corresponding with word line 7) may be programmed and program verified while all the other 28 memory cell transistors remain in the erased data state.

Figure 9B:
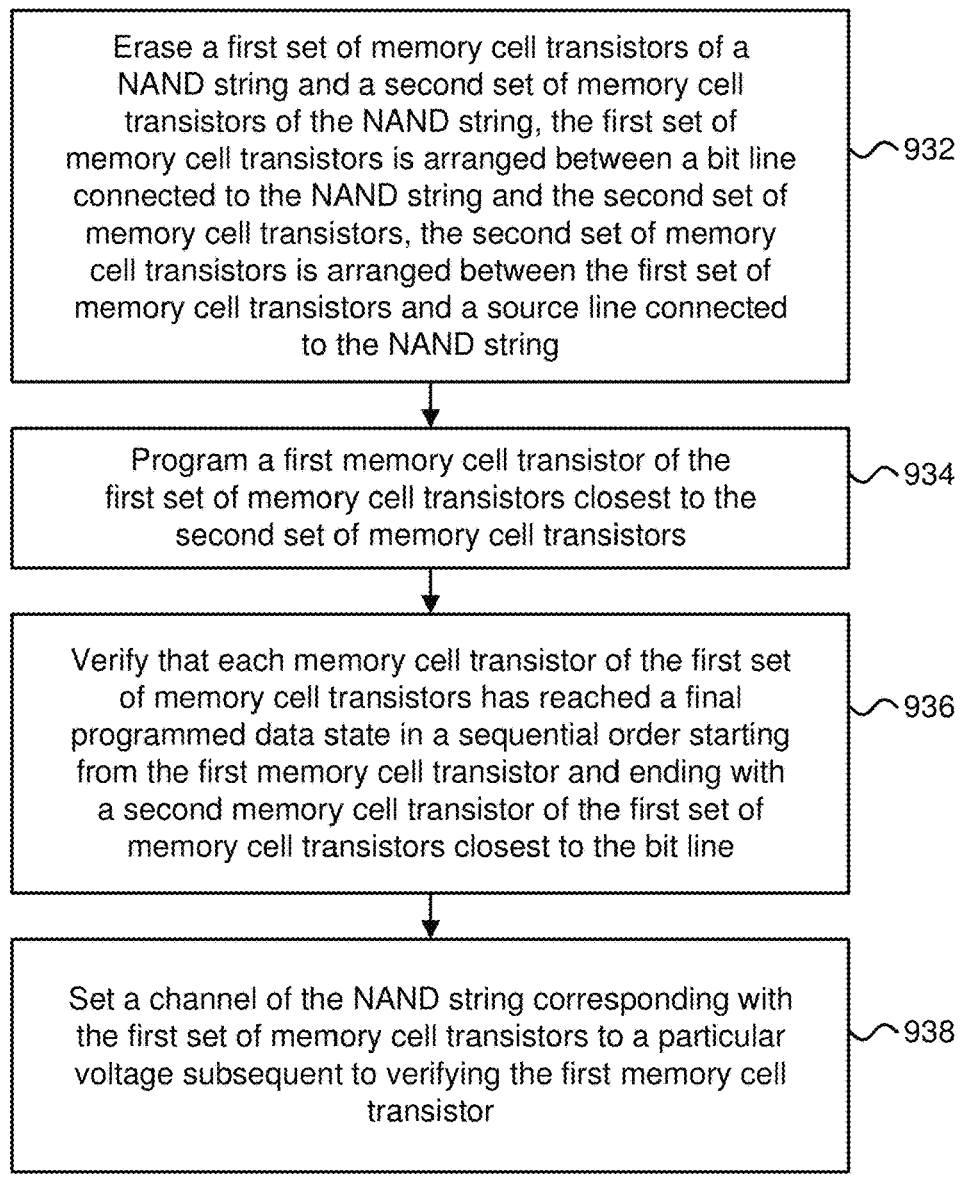
FIG. 9B is a flowchart describing an alternative embodiment of a process for programming and verifying memory cells within a memory array.

FIG. 9B is a flowchart describing another embodiment of a process for programming and verifying memory cells within a memory array. In one embodiment, the process of FIG. 9B may be performed by a non-volatile storage system, such as non-volatile storage system 596 in FIG. 5A.

In step 932, a first set of memory cell transistors of a NAND string is erased and a second set of memory cell transistors of the NAND string is erased. In this case, the memory cells corresponding with the first set of memory cell transistors and the second set of memory cell transistors may be set into erased data states or within a threshold voltage distribution associated with the erased data state, such as the threshold voltage distribution 700 in FIG. 7A. The first set of memory cell transistors is arranged between a bit line connected to the NAND string and the second set of memory cell transistors. The second set of memory cell transistors is arranged between the first set of memory cell transistors and a source line connected to the NAND string. In one example, referring to FIG. 8A, the first set of memory cell transistors may correspond with the memory cell transistors connected to word lines WL48-WL95 and the second set of memory cell transistors may correspond with the memory cell transistors connected to word lines WL0-WL47. The second set of memory cell transistors may connect to the source line via a source-side select gate transistor. The first set of memory cell transistors may connect to the bit line via a drain-side select gate transistor.

In step 934, a first memory cell transistor of the first set of memory cell transistors closest to the second set of memory cell transistors is programmed. The first memory cell transistor may comprise a floating-gate transistor or a charge trap transistor. In one example, referring to FIG. 8A, the memory cell transistor connected to word line WL48 may comprise the memory cell transistor out of the set of memory cell transistors connected to word lines WL48-WL95 that is closest to the set of memory cell transistors connected to word lines WL0-WL47. In some cases, the first memory cell transistor may be adjacent to a memory cell transistor of the second set of memory cell transistors (e.g., if no tier select gate transistors or internal dummy transistors are used within a NAND string). In step 936, it is verified that each memory cell transistor of the first set of memory cell transistors has reached a final programmed data state in a sequential order starting from the first memory cell transistor and ending with a second memory cell transistor of the first set of memory cell transistors closest to the bit line.

In one example, referring to FIG. 8A, the memory cell transistor connected to word line WL48 may be program verified prior to the memory cell transistor connected to word line WL49 being program verified and the memory cell transistor connected to word line WL49 may be program verified prior to the memory cell transistor connected to word line WL50 being program verified; subsequently, the memory cell transistor connected to word line WL94 may be program verified prior to the memory cell transistor connected to word line WL95 being program verified. In step 938, a channel of the NAND string corresponding with the first set of memory cell transistors may be set to a particular voltage subsequent to verifying the first memory cell transistor of the first set of memory cell transistors. The particular voltage may be greater than the bit line voltage applied to the bit line while verifying the first memory cell transistor. The particular voltage may be applied subsequent to verification of the first memory cell transistor and prior to deselection of the first memory cell transistor and/or prior to the bit line falling below the bit line voltage applied to the bit line while verifying the first memory cell transistor.

In some embodiments, a middle-out erase sequence may be performed in which memory cell transistors in the middle of the NAND string are erased and erase verified prior to erasing and verifying other memory cell transistors towards the drain-side end of the NAND string and/or the source-side end of the NAND string. In one example, for a NAND string with 32 memory cell transistors corresponding with word lines WL0 through WL31 from the source-side end of the NAND string to the drain-side end of the NAND string, the memory cell transistor corresponding with word line WL16 may be erased and erase verified prior to erasing the memory cell transistor corresponding with word line WL15. In another example, the memory cell transistor corresponding with word line WL16 may be erased and erase verified prior to erasing the memory cell transistor corresponding with word line WL15 and prior to erasing the memory cell transistor corresponding with word line WL17. In another example, the memory cell transistor corresponding with word line WL16 may be erased and erase verified prior to beginning programming of the memory cell transistor corresponding with word line WL15 and the memory cell transistor corresponding with word line WL15 may be erased and erase verified prior to beginning erasing of the memory cell transistor corresponding with word line WL14.

One embodiment of the disclosed technology includes a NAND string and a control circuit. The NAND string may including a first set of memory cells and a second set of memory cells. The first set of memory cells may comprise floating-gate transistors, charge trap transistors, ReRAM memory cells, MRAM memory cells, or phase change memory cells. The first set of memory cells may be arranged between a first control line (e.g., a source line) and the second set of memory cells. The second set of memory cells may be arranged between the first set of memory cells and a second control line (e.g., a bit line). The control circuit may be configured to verify that each memory cell of the first set of memory cells is in a final programmed data state in a sequential order starting from a first memory cell of the first set of memory cells closest to the second set of memory cells and ending with a second memory cell of the first set of memory cells closest to the first control line. The control circuit may be configured to verify a programmed data state of the first memory cell while each of the second set of memory cells is in an erased data state.

One embodiment of the disclosed technology includes a NAND string and a control circuit. The NAND string including a first set of memory cell transistors and a second set of memory cell transistors. The first set of memory cell transistors arranged between a bit line and the second set of memory cell transistors. The second set of memory cell transistors arranged between the first set of memory cell transistors and a source line. The control circuit configured to verify that each memory cell transistor of the second set of memory cell transistors has reached a final programmed data state in a sequential order starting from a first memory cell transistor of the second set of memory cell transistors closest to the first set of memory cell transistors and ending with a second memory cell transistor of the second set of memory cell transistors closest to the source line. The control circuit configured to verify a programmed data state of the first memory cell transistor while each of the first set of memory cell transistors is in an erased data state.

One embodiment of the disclosed technology includes a NAND string and a control circuit. The NAND string including a first set of memory cell transistors and a second set of memory cell transistors. The first set of memory cell transistors arranged between a bit line and the second set of memory cell transistors. The second set of memory cell transistors arranged between the first set of memory cell transistors and a source line. The control circuit configured to verify that each memory cell transistor of the first set of memory cell transistors has reached a final programmed data state in a sequential order starting from a first memory cell transistor of the first set of memory cell transistors closest to the second set of memory cell transistors and ending with a second memory cell transistor of the first set of memory cell transistors closest to the bit line. The control circuit configured to verify a programmed data state of the first memory cell transistor while each of the second set of memory cell transistors is in an erased data state.

One embodiment of the disclosed technology includes a NAND string and a control circuit. The NAND string including a first set of transistors and a second set of transistors. The first set of transistors arranged between a bit line and the second set of transistors. The second set of transistors arranged between the first set of transistors and a source line. The control circuit configured to verify a programmed data state of a first memory cell transistor of the second set of transistors and apply a source line voltage to the source line during verification of the programmed data state of the first memory cell transistor. The control circuit configured to set a channel of the NAND string corresponding with the second set of memory cell transistors to a particular voltage greater than the source line voltage subsequent to verification of the programmed data state of the first memory cell transistor.

For purposes of this document, it should be noted that the dimensions of the various features depicted in the figures may not necessarily be drawn to scale.

For purposes of this document, reference in the specification to "an embodiment," "one embodiment," "some embodiments," or "another embodiment" may be used to describe different embodiments and do not necessarily refer to the same embodiment.

For purposes of this document, a connection may be a direct connection or an indirect connection (e.g., via another part). In some cases, when an element is referred to as being connected or coupled to another element, the element may be directly connected to the other element or indirectly connected to the other element via intervening elements. When an element is referred to as being directly connected to another element, then there are no intervening elements between the element and the other element.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. An apparatus, comprising:
  a NAND string including a first set of memory cells and a second set of memory cells, the first set of memory cells arranged between a first control line and the second set of memory cells, the second set of memory cells arranged between the first set of memory cells and a second control line; and
  a control circuit configured to determine that each memory cell of the first set of memory cells is in a final programmed data state in a sequential order starting from a first memory cell of the first set of memory cells closest to the second set of memory cells and ending with a second memory cell of the first set of memory cells closest to the first control line, the control circuit configured to verify a programmed data state of the first memory cell while each of the second set of memory cells is in an erased data state, the first control line comprises a source line and the second control line comprises a bit line, the control circuit configured to apply a bit line voltage to the bit line during verification of the programmed data state of the first memory cell and set a channel of the NAND string corresponding to the first set of memory cells to a particular voltage greater than the bit line voltage subsequent to verification of the programmed data state of the first memory cell.

2. The apparatus of claim 1, wherein:
  the control circuit configured to verify the final programmed data state of each memory cell of the first set of memory cells in the sequential order starting from the first memory cell of the first set of memory cells closest to the second set of memory cells and ending with the second memory cell of the first set of memory cells closest to the source line.

3. The apparatus of claim 1, wherein:
  the control circuit configured to set at least one of the second set of memory cells into a non-conducting state while each of the first set of memory cells remains in a conducting state subsequent to verification of the programmed data state of the first memory cell.

4. The apparatus of claim 1, wherein:
  the control circuit configured to apply one or more programming pulses to the first memory cell prior to verification of the programmed data state of the first memory cell.

5. The apparatus of claim 1, wherein:
the NAND string comprises a vertical NAND string.

6. An apparatus, comprising:
a NAND string including a first set of memory cells and a second set of memory cells, the first set of memory cells arranged between a source line and the second set of memory cells, the second set of memory cells arranged between the first set of memory cells and a bit line; and
a control circuit configured to verify that each memory cell of the first set of memory cells is in a final programmed data state in a sequential order starting from a first memory cell of the first set of memory cells closest to the second set of memory cells and ending with a second memory cell of the first set of memory cells closest to the source line, the control circuit configured to verify a programmed data state of the first memory cell while each of the second set of memory cells is in an erased data state, the control circuit configured to apply a bit line voltage to the bit line during verification of the programmed data state of the first memory cell and set a channel of the NAND string corresponding to the first set of memory cells to a particular voltage greater than the bit line voltage subsequent to verification of the programmed data state of the first memory cell.

7. The apparatus of claim 6, wherein:
the control circuit configured to verify the final programmed data state of the first memory cell of the first set of memory cells prior to verifying the final programmed data state of a third memory cell of the first set of memory cells, the first memory cell is connected to a first word line and the third memory cell is connected to a second word line adjacent to the first word line.

8. The apparatus of claim 7, wherein:
the control circuit configured to verify the final programmed data state of the third memory cell of the first set of memory cells prior to verifying a fourth memory cell of the first set of memory cells, the fourth memory cell is connected to a third word line adjacent to the second word line.

9. The apparatus of claim 8, wherein:
the first memory cell is adjacent to the third memory cell; and
the third memory cell is adjacent to the fourth memory cell.

10. The apparatus of claim 7, wherein:
the control circuit configured to verify the final programmed data state of each memory cell of the first set of memory cells in the sequential order starting from the first memory cell of the first set of memory cells closest to the second set of memory cells followed by the third memory cell of the first set of memory cells and ending with the second memory cell of the first set of memory cells closest to the source line.

11. The apparatus of claim 6, wherein:
the control circuit configured to apply a bit line voltage to the bit line during verification of the programmed data state of the first memory cell and set the source line connected to a channel of the NAND string corresponding with the first set of memory cells to a particular voltage greater than the bit line voltage subsequent to verification of the programmed data state of the first memory cell.

12. The apparatus of claim 6, wherein:
the control circuit configured to set at least one of the second set of memory cells into a non-conducting state while each of the first set of memory cells remains in a conducting state subsequent to verification of the programmed data state of the first memory cell.

13. The apparatus of claim 6, wherein:
the control circuit configured to apply one or more programming pulses to the first memory cell prior to verification of the programmed data state of the first memory cell.

14. The apparatus of claim 6, wherein:
the NAND string comprises a vertical NAND string.

15. An apparatus, comprising:
a NAND string including a first set of memory cells and a second set of memory cells, the first set of memory cells arranged between a first control line and the second set of memory cells, the second set of memory cells arranged between the first set of memory cells and a second control line, the first control line comprises a source line, the second control line comprises a bit line; and
a control circuit configured to determine that each memory cell of the first set of memory cells is in a final programmed data state in an order starting from a first memory cell of the first set of memory cells closest to the second set of memory cells and ending with a second memory cell of the first set of memory cells closest to the first control line, the control circuit configured to verify a programmed data state of the first memory cell while each of the second set of memory cells is in an erased data state, the control circuit configured to apply a bit line voltage to the bit line during verification of the programmed data state of the first memory cell and set a channel of the NAND string corresponding to the first set of memory cells to a particular voltage greater than the bit line voltage subsequent to verification of the programmed data state of the first memory cell.

16. The apparatus of claim 15, wherein:
the control circuit configured to verify that each memory cell of the first set of memory cells is in a final programmed data state in the sequential order starting from the first memory cell of the first set of memory cells closest to the second set of memory cells and ending with the second memory cell of the first set of memory cells closest to the source line.

17. The apparatus of claim 15, wherein:
the control circuit configured to set at least one of the second set of memory cells into a non-conducting state while each of the first set of memory cells remains in a conducting state subsequent to verification of the programmed data state of the first memory cell.

18. The apparatus of claim 15, wherein:
the control circuit configured to apply one or more programming pulses to the first memory cell prior to verification of the programmed data state of the first memory cell.

* * * * *